(12) United States Patent
Davis et al.

(10) Patent No.: US 8,952,695 B2
(45) Date of Patent: Feb. 10, 2015

(54) SYSTEM OF RECEIVE COILS AND PADS FOR USE WITH MAGNETIC RESONANCE IMAGING

(76) Inventors: Albert Michael Davis, Richardson, TX (US); James Allen Higgins, Plano, TX (US); Rostislav Lemdiasov, Plano, TX (US)

(*) Notice: Subject to any disclaimer, the term of this patent is extended or adjusted under 35 U.S.C. 154(b) by 404 days.

(21) Appl. No.: 13/366,350

(22) Filed: Feb. 5, 2012

(65) Prior Publication Data

US 2012/0133366 A1 May 31, 2012

Related U.S. Application Data

(63) Continuation of application No. 13/299,804, filed on Nov. 18, 2011.

(60) Provisional application No. 61/344,948, filed on Nov. 26, 2010, provisional application No. 61/485,831, filed on May 13, 2011.

(51) Int. Cl.
*G01R 33/34* (2006.01)
*G01R 33/3415* (2006.01)

(52) U.S. Cl.
CPC .... *G01R 33/34084* (2013.01); *G01R 33/34007* (2013.01); *G01R 33/3415* (2013.01)
USPC .......................................................... 324/318

(58) Field of Classification Search
USPC ................................................ 324/300–322
See application file for complete search history.

(56) References Cited

U.S. PATENT DOCUMENTS

| | | | |
|---|---|---|---|
| 4,634,980 A | 1/1987 | Misic et al. | |
| 4,763,345 A | 8/1988 | Barbaric et al. | |
| D313,073 S | 12/1990 | Kaufman et al. | |
| D320,660 S | 10/1991 | Foreman et al. | |
| 5,150,710 A | 9/1992 | Hall et al. | |
| 5,361,765 A | 11/1994 | Herlihy et al. | |
| 5,363,845 A | 11/1994 | Chowdhury et al. | |
| 5,386,191 A | 1/1995 | Mccarten et al. | |
| 5,594,337 A * | 1/1997 | Boskamp | 324/318 |
| D380,832 S | 7/1997 | Isshiki et al. | |
| D393,068 S | 3/1998 | Isshiki | |
| D408,915 S | 4/1999 | Ogiwara | |
| 5,928,148 A * | 7/1999 | Wang et al. | 600/420 |
| D441,866 S | 5/2001 | Marchesi | |
| 6,230,040 B1 * | 5/2001 | Wang et al. | 600/415 |
| 6,577,888 B1 * | 6/2003 | Chan et al. | 600/422 |
| 6,591,128 B1 | 7/2003 | Wu et al. | |
| 6,644,852 B2 | 11/2003 | Crain et al. | |
| 6,650,926 B1 | 11/2003 | Chan et al. | |
| 6,714,012 B2 * | 3/2004 | Belt et al. | 324/318 |
| 6,778,849 B1 | 8/2004 | Ninomiya et al. | |
| 6,946,836 B2 * | 9/2005 | Kuhara | 324/307 |
| 7,026,818 B2 * | 4/2006 | Machida et al. | 324/322 |
| 7,049,819 B2 * | 5/2006 | Chan et al. | 324/319 |
| 7,176,689 B2 * | 2/2007 | Machida et al. | 324/318 |
| 7,190,164 B2 * | 3/2007 | Kuhara | 324/309 |
| 7,336,076 B2 * | 2/2008 | Kuhara | 324/318 |
| D563,555 S | 3/2008 | Kasai et al. | |

(Continued)

*Primary Examiner* — Dixomara Vargas
(74) *Attorney, Agent, or Firm* — Bill R. Naifeh

(57) ABSTRACT

There is described embodiments of a coil and pad system for use with an MRI machine. The coil and pad system includes a plurality of coils sized to accommodate a plurality of patient ranges of various heights and body weights. There is also a plurality of pads designed to work in conjunction with the plurality of coils to accommodate patient ranges of various heights and body weights.

12 Claims, 19 Drawing Sheets

(56) References Cited

U.S. PATENT DOCUMENTS

| | | |
|---|---|---|
| D563,556 S | 3/2008 | Baba |
| 7,423,428 B2 * | 9/2008 | Kuhara ........................ 324/307 |
| 7,446,529 B2 * | 11/2008 | Okamoto ...................... 324/318 |
| D591,862 S | 5/2009 | Taniguchi et al. |
| D592,751 S | 5/2009 | Ninomiya et al. |
| 7,646,199 B2 * | 1/2010 | Dannels et al. .............. 324/318 |
| 7,696,752 B2 * | 4/2010 | Takamori ...................... 324/307 |
| 7,884,608 B2 * | 2/2011 | Okamoto ...................... 324/318 |
| 8,035,380 B2 * | 10/2011 | Kasugai ......................... 324/309 |
| 8,046,046 B2 * | 10/2011 | Chan et al. .................... 600/422 |
| 8,179,136 B2 * | 5/2012 | Chan et al. .................... 324/318 |
| 8,188,740 B2 | 5/2012 | Ninomiya et al. |
| D683,024 S | 5/2013 | Baba |
| 2012/0133365 A1 * | 5/2012 | Davis et al. ................... 324/318 |

* cited by examiner

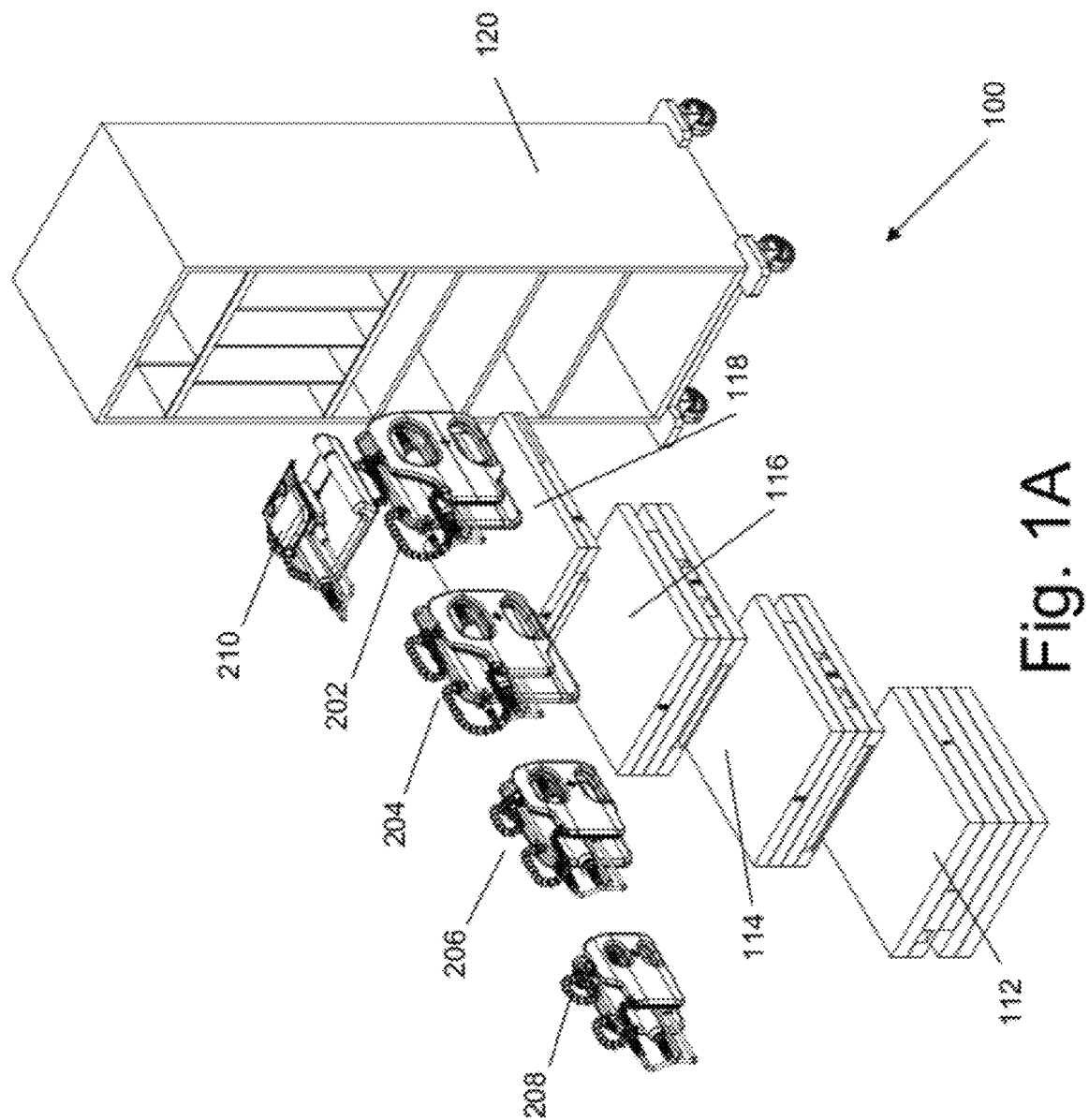

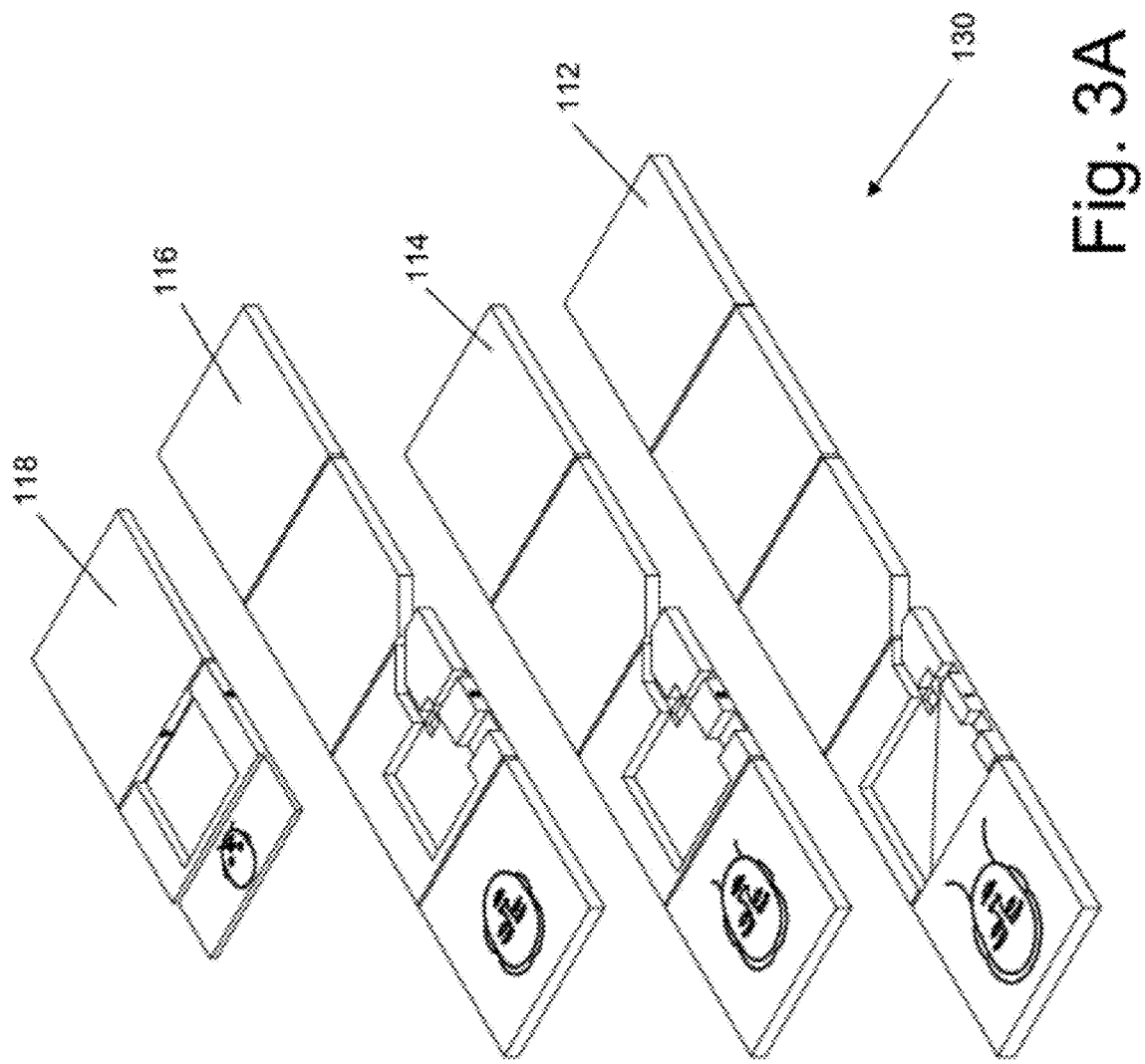

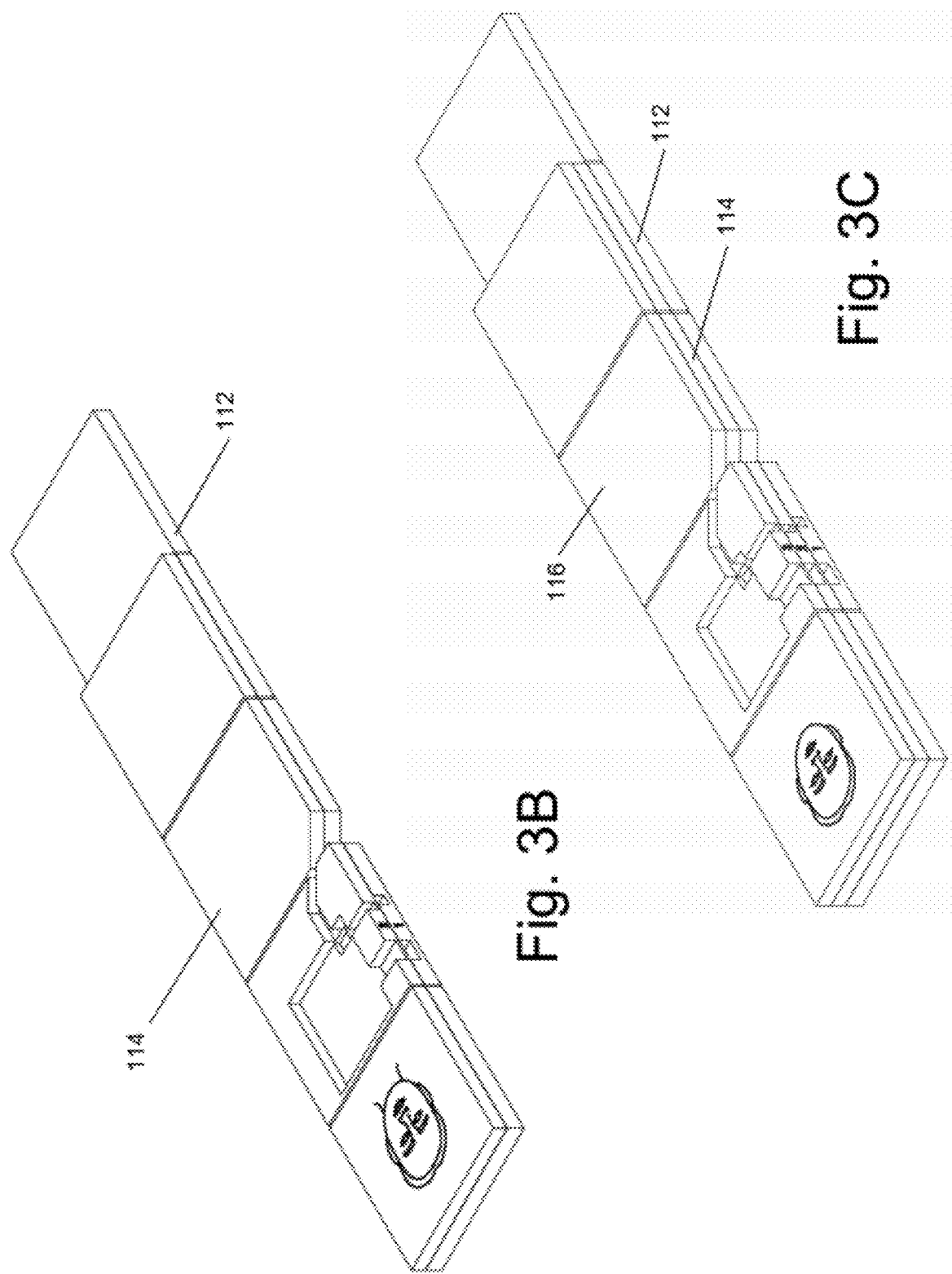

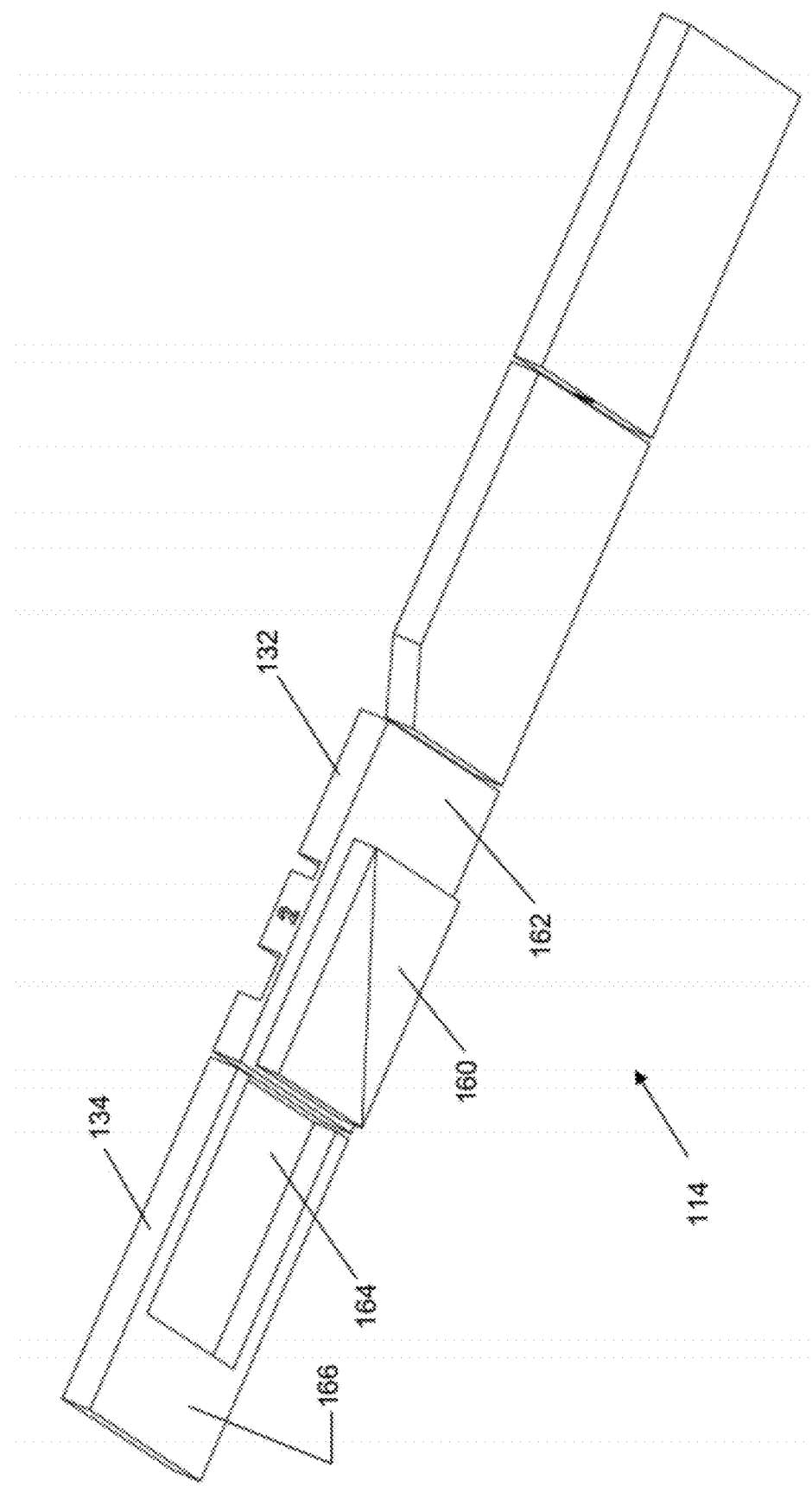

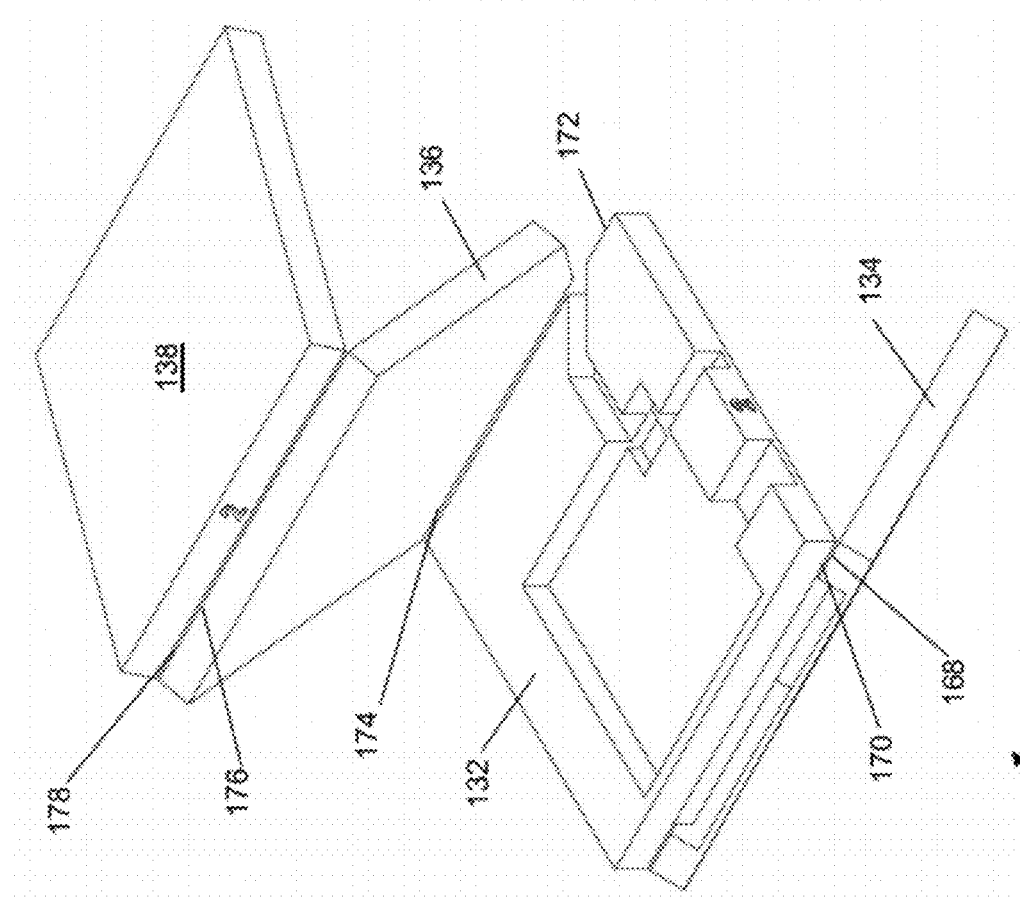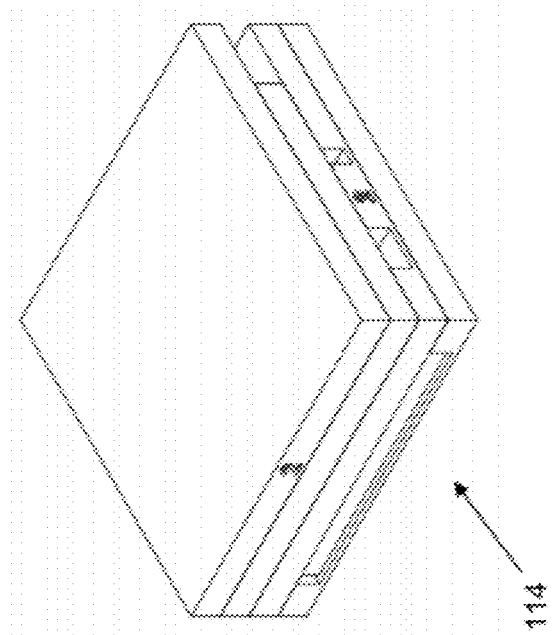

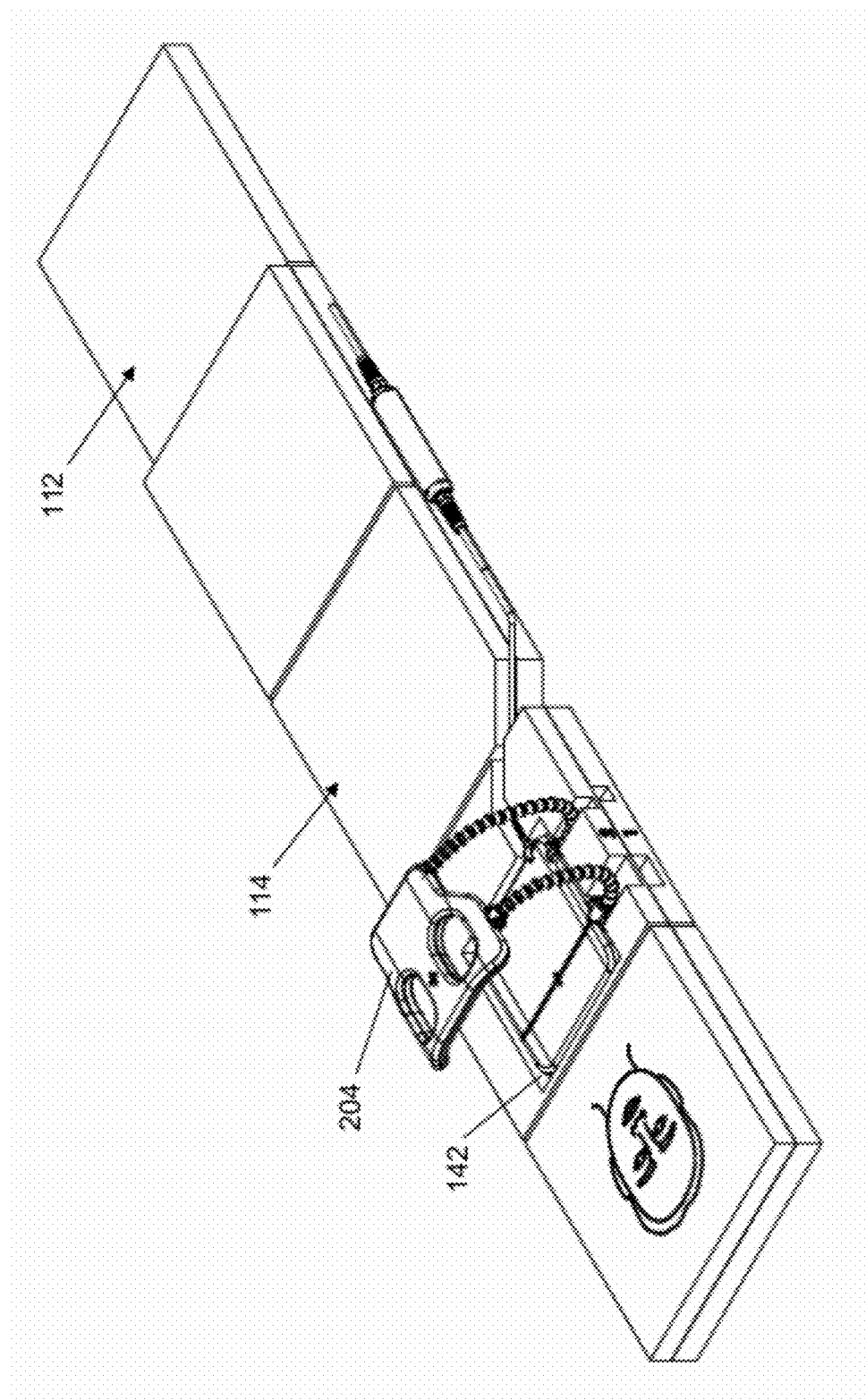

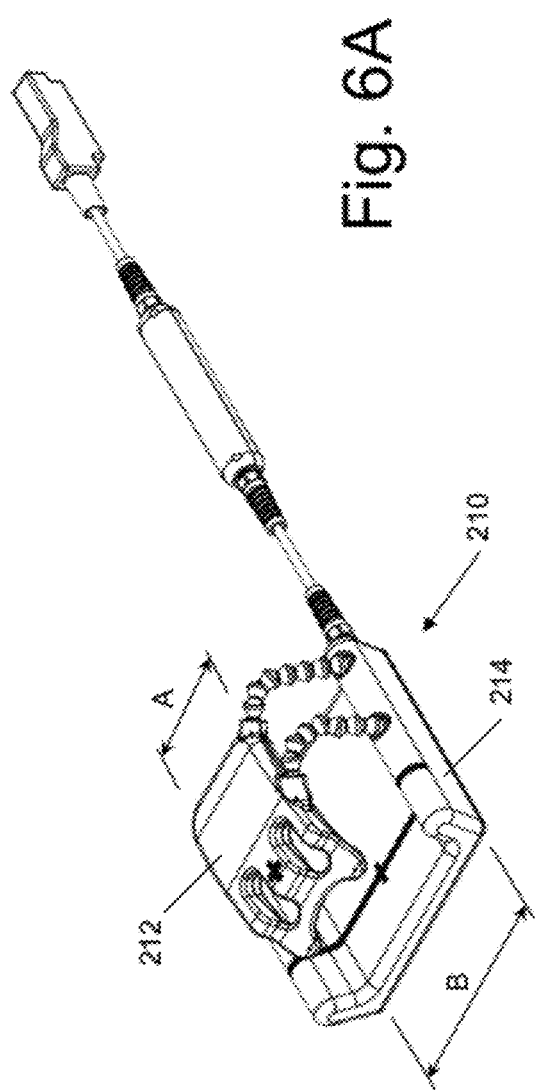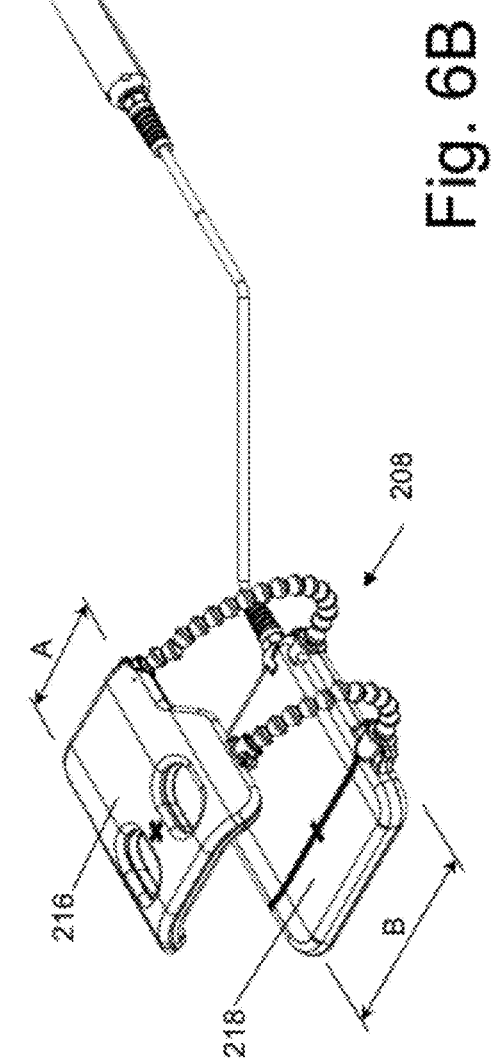

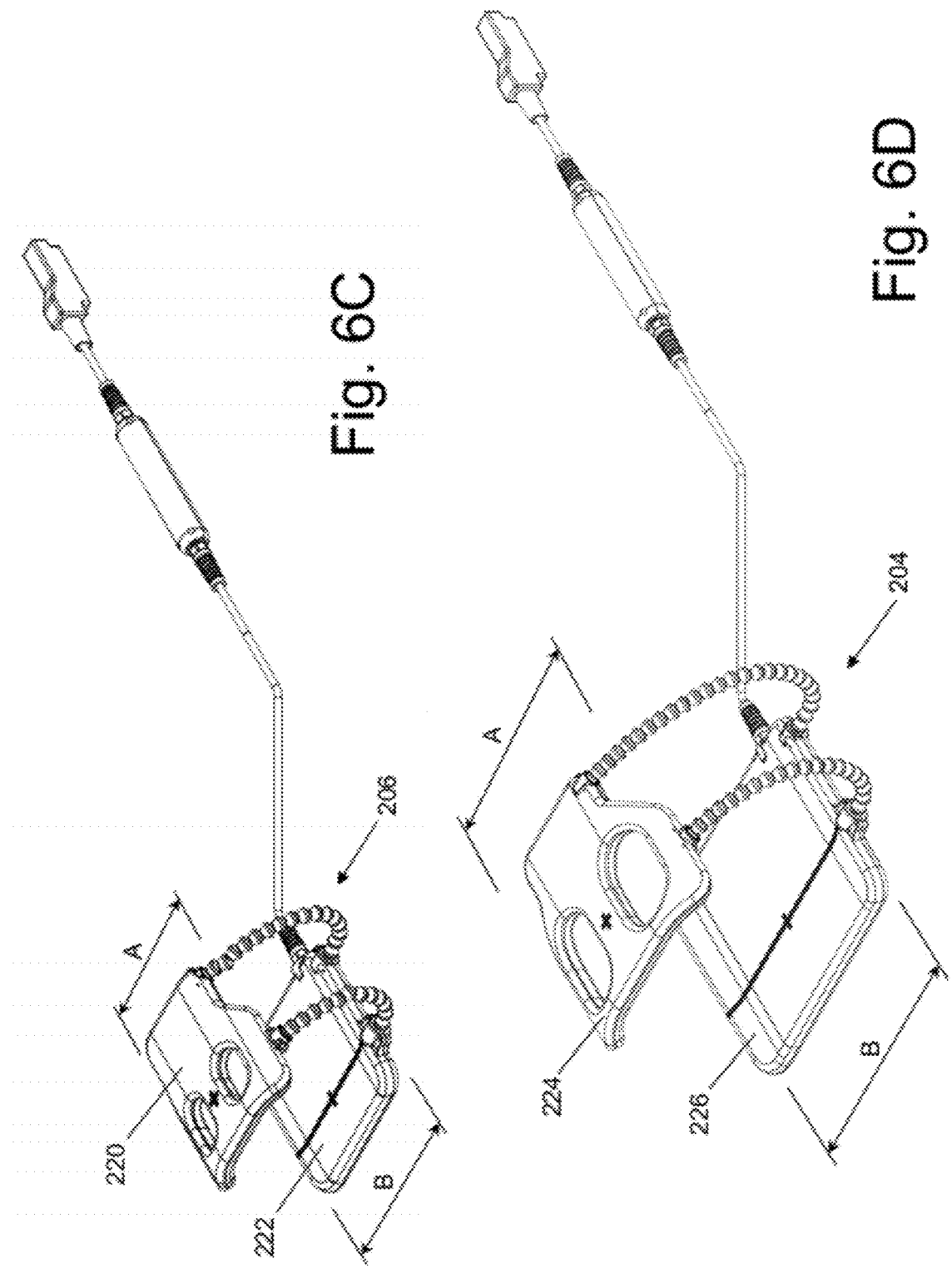

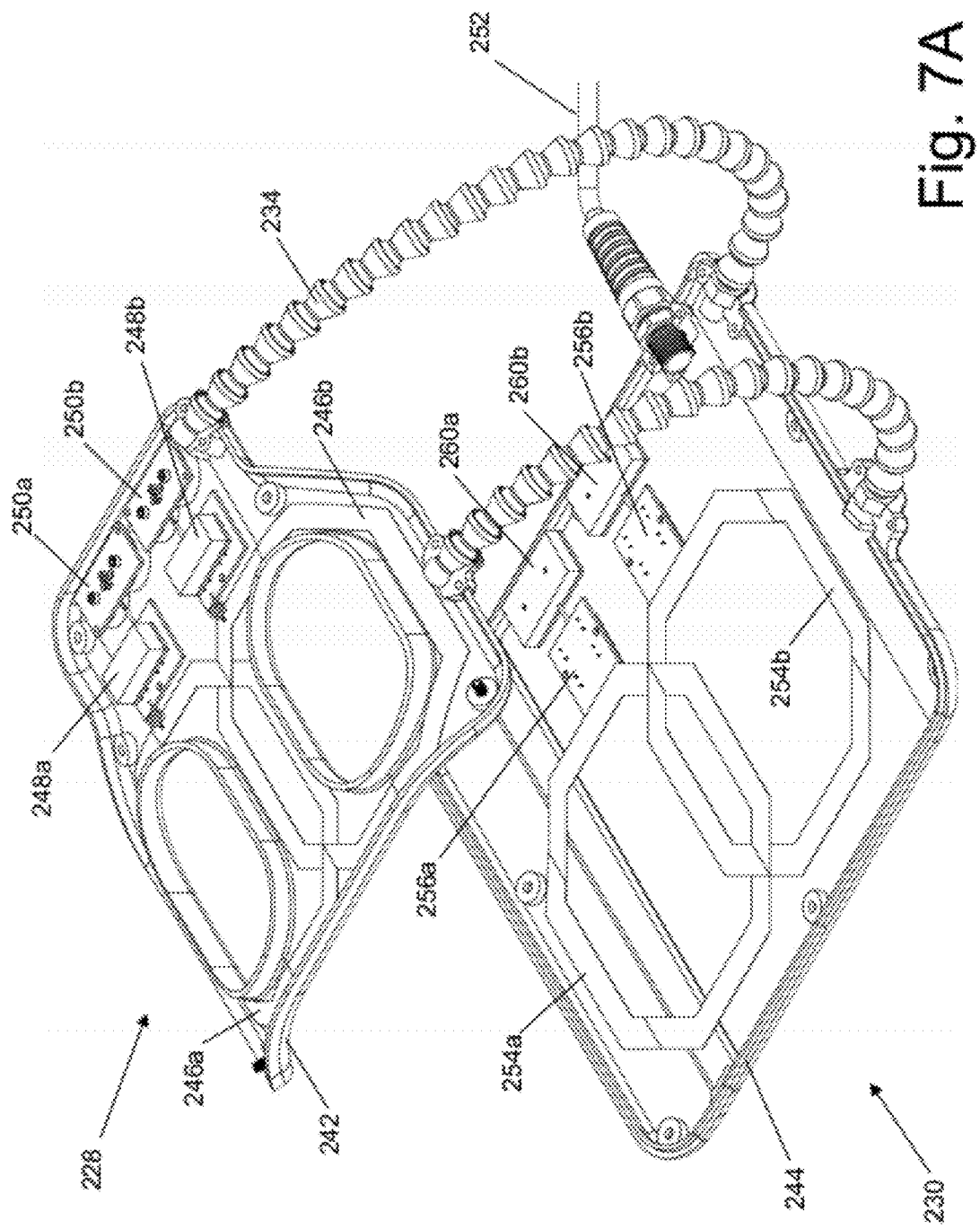

SYSTEM OF RECEIVE COILS AND PADS FOR USE WITH MAGNETIC RESONANCE IMAGING

CROSS REFERENCE TO RELATED APPLICATIONS

This application is a continuation of U.S. application Ser. No. 13/299,804, filed Nov. 18, 2011, which claims the benefit of the filing date of U.S. Provisional Application No. 61/344,948, filed Nov. 26, 2010 and U.S. Provisional Application No. 61/485,831, filed May 13, 2011, the disclosures of which are incorporated herein by reference for all purposes.

This application also claims the benefit of the filing date of U.S. Provisional Application No. 61/485,831, filed May 13, 2011, the disclosure of which is incorporated herein by reference for all purposes.

TECHNICAL FIELD

The invention relates in general to magnetic resonance imaging, and in particular to receive coil and pad systems for magnetic resonance imaging.

BACKGROUND INFORMATION

Magnetic resonance imaging (MRI) is a medical imaging technique used to visualize detailed internal structures. MRI makes use of the property of Nuclear magnetic resonance (NMR) to image nuclei of atoms inside the body.

An MRI machine uses a powerful magnetic field to align the magnetization of some atoms in the body, and radio frequency fields to systematically alter the alignment of this magnetization. This causes the nuclei to produce a rotating magnetic field detectable by a scanner and this information is recorded to construct an image of the scanned area of the body. Strong magnetic field gradients cause nuclei at different locations to rotate at different speeds. 3-D spatial information can be obtained by providing gradients in each direction. The nuclei absorb the external radio frequency (RF) in the transmit phase and a RF signal of its own receive phase. This signal is captured with the antenna. The signal is then amplified and processed to create an image.

MRI provides good contrast between the different soft and hard tissues of the body, it is especially useful in imaging the brain, muscles, the heart, and cancers compared to other medical imaging techniques such as computed tomography (CT) or X-rays. Unlike CT scans or traditional X-rays, MRI uses no ionizing radiation. Thus, it is possible to image and diagnose people of any age with MRI. Due to its flexibility and sensitivity to a broad range of tissue properties, MRI has recently been in the forefront of research and development, especially in pediatric imaging.

Most pediatric magnetic resonance imaging applications currently use adult RF coils to produce images of children and people of smaller proportions. It is believed that the use of full size coils on a child or patient of smaller proportions reduces the quality of pediatric images. Full size coils have a large field of view (FOV) spanned by their physical dimensions. Consequently, the use of adult coils over smaller anatomies often reduces signal to noise ratio (SNR) and imaging resolution, resulting in sub-optimal image quality.

What is needed, therefore, is a device or system which can produce high resolution and high SNR in the images of infants and smaller patients with smaller proportions.

SUMMARY

In response to these and other problems, in one embodiment, there is a coil and pad system for use with an MRI machine. The coil and pad system includes a plurality of coils sized for a plurality of patient ranges of various heights and body weights. There is also a plurality of pads designed to work in conjunction with the plurality of coils to accommodate patients of various heights and body weights.

By providing coils and pads specific to a particular patient range, the field of view is reduced and the SNR is increased resulting in better image resolution.

These and other features, and advantages, will be more clearly understood from the following detailed description taken in conjunction with the accompanying drawings. It is important to note the drawings are not intended to represent the only aspect of the invention.

BRIEF DESCRIPTION OF THE DRAWINGS

FIG. 1A is a perspective exploded view illustrating one embodiment of a coil and pad system for use with an MRI machine.

FIG. 3A is an exploded view illustrating one embodiment of a pad system for use with an MRI machine.

FIG. 3B is an isometric view showing two pads of the pad system of FIG. 3A.

FIG. 3C is an isometric view showing three pads of the pad system of FIG. 3A.

FIG. 4B is an isometric bottom view of the pad of FIG. 4A.

FIG. 4C is an isometric view of the pad of FIG. 4A in a semi-collapsed configuration.

FIG. 4D is an isometric view of the pad of FIG. 4A in a fully collapsed configuration.

FIG. 5A is an isometric view of certain pads coupled to a coil.

FIGS. 6A through 6E are isometric views illustrating various embodiments of individual coils of a coil system.

FIG. 7A is a detailed isometric view of a portion of a coil.

DETAILED DESCRIPTION

Figure 1B:
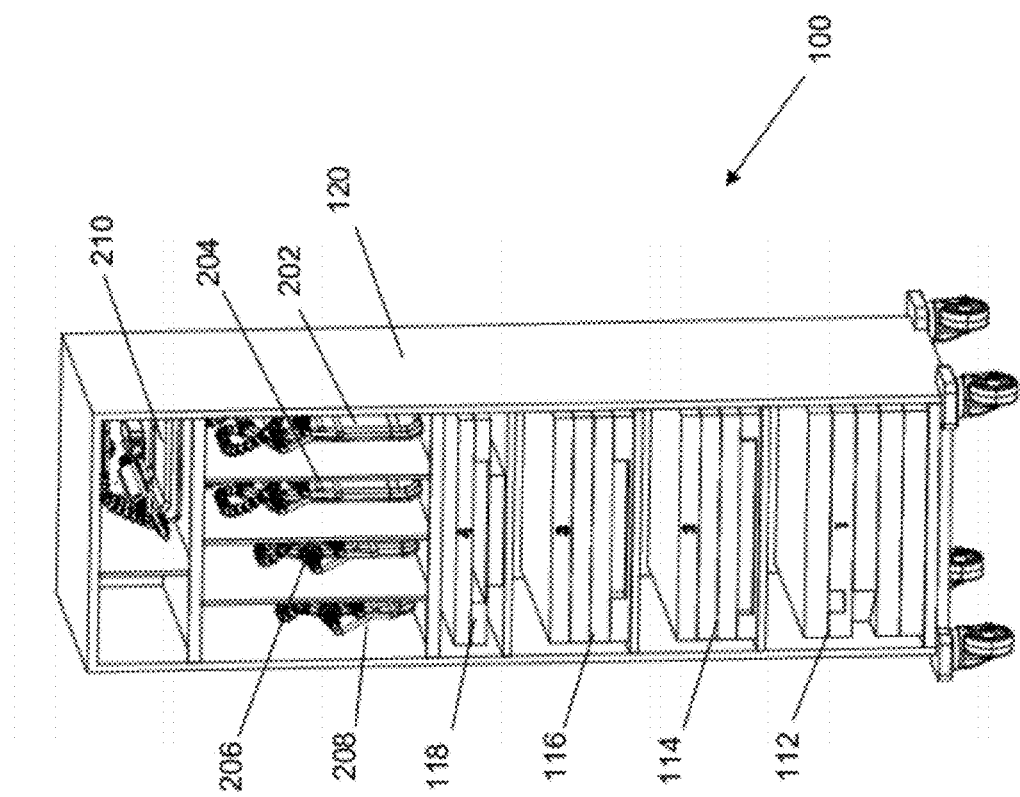
FIG. 1B is an isometric view of the coil and pad system of FIG. 1A showing the coils and pad positioned within a storage unit.

For the purposes of promoting an understanding of the principles of the present inventions, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the inventions as described herein are contemplated as would normally occur to one skilled in the art to which the invention relates.

FIG. 1A is an exploded isometric view of a coil and pad system 100. FIG. 1B is an isometric view of the coil and pad system 100 showing the coils and pads in storage. In FIGS. 1A and 1B, there is presented one embodiment of the coil and pad system 100 for use with an MRI machine (not shown). In the illustrated embodiment, there is a plurality of coils, such as coil 202, coil 204, coil 206, coil 208, and coil 210. There is also a plurality of corresponding pads, such as pad 112, pad 114, pad 116, and pad 118. Additionally, there is illustrated one embodiment of a storage cart 120 for storing the coils and pads.

Although five coils 202-210 are illustrated, the present invention may have any number of coils and pads. Some embodiments may have as few as three coils. Other embodiments may have six or more coils.

Figure 2:
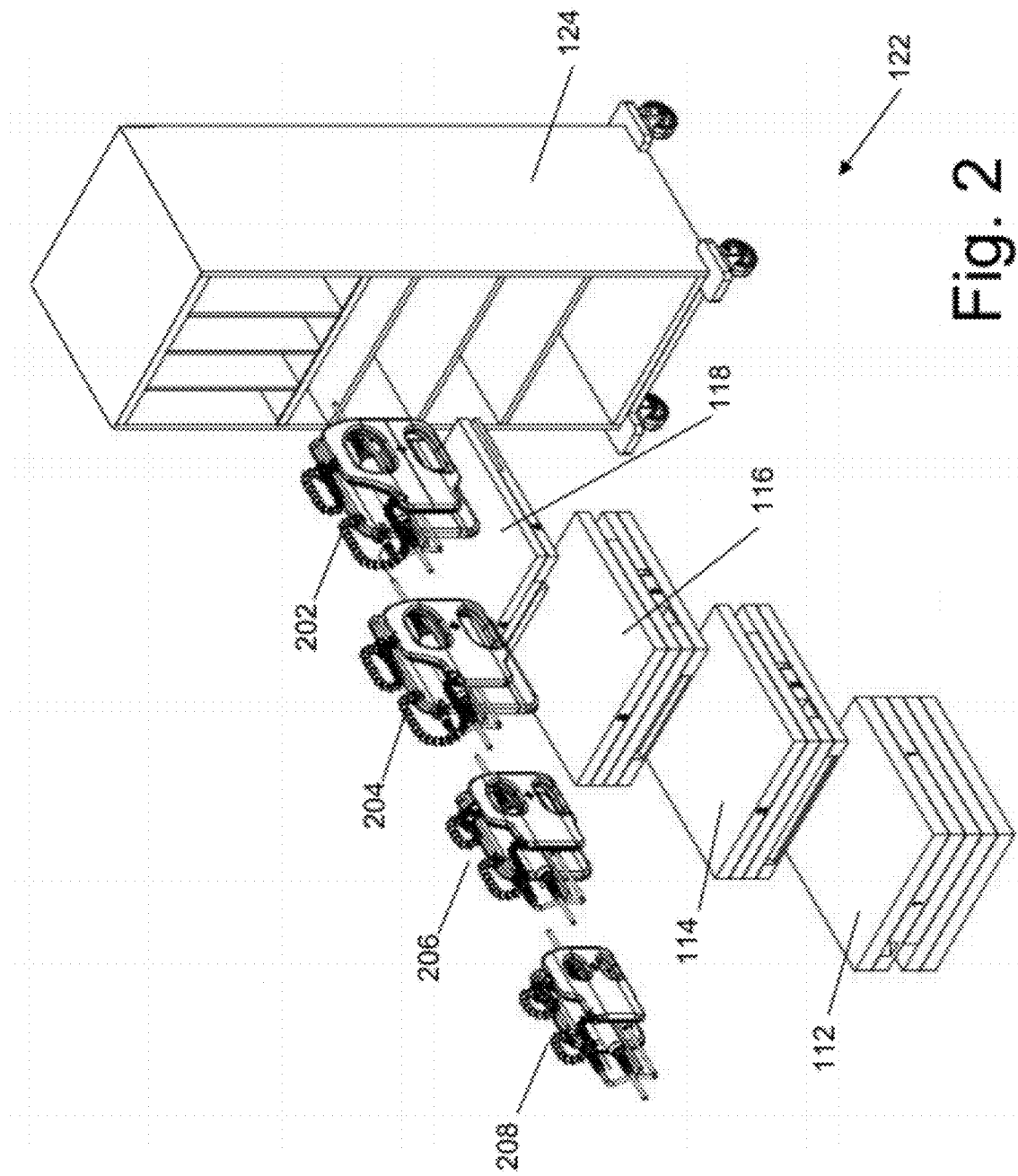
FIG. 2 is a perspective exploded view illustrating a second embodiment of a coil and pad system for use with an MRI machine.

Generally corresponding to the five coils 202-210 are the pads 112-118. Note that in this illustrated embodiment, there is not a direct one to one correlation between the five coils 202-210 and the four pads 112-118. This is because two of the coils may be used with the same pad configuration. However, in other embodiments, there may be a one to one correlation. For instance, FIG. 2 illustrates a system 122 using four coils 202-208 and four pads 112-118 with an alternative embodiment of a storage cart 124.

Turning now to FIG. 3, there is illustrated a pad system 130. In this embodiment, the pad system 130 comprises four pads 112 through 118. The pad system 130 is designed to raise a patient to a desired height within an MRI machine. When the patient is raised to a desired height and a corresponding coil is used, the MRI machine achieves better image resolution than with conventional measures.

When scanning a relatively large patient, such as an older teenager or adult, only one pad may be used (i.e., pad 112) in conjunction with a corresponding coil (i.e. coil 202—not shown).

When scanning a smaller patient, such as an adolescent, two pads may be required to place the adolescent patient at the desired height within the MRI machine. Thus, the pad 114 may be placed on top of the pad 112 to raise an adolescent patient to the desired height as illustrated in FIG. 3B.

Similarly, a child may need to be positioned at even a greater height within the MRI machine. When imaging a child, three pads may be required to place the child at the proper height. Thus, pad 116 may be placed on top of pad 114. In turn, pad 114 is placed on top of pad 112. Thus the combination of pad 116, pad 114, and pad 112 may be used to raise the child patient to the desired height within the MRI machine as illustrated in FIG. 3C.

Figure 3D:
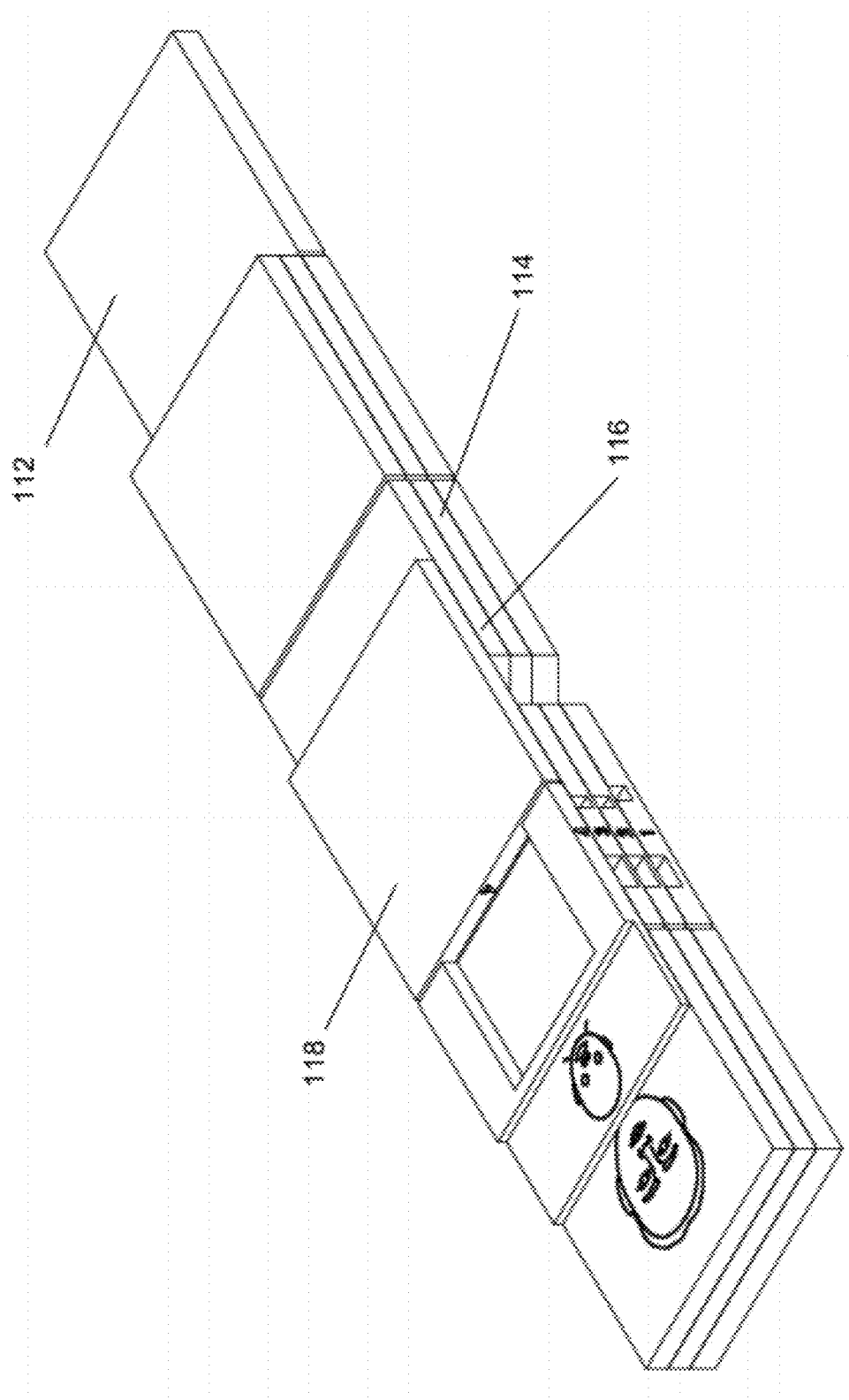
FIG. 3D is an isometric view showing four pads of the pad system of FIG. 3A.

An infant or baby may need to be positioned at even an additional height within the MRI machine. When imaging an infant, four pads may be required to place the infant at the desired height. Thus, pad 112, pad 114, pad 116, and pad 118 may be used together to raise the infant patient to the desired height within the MRI machine as illustrated in FIG. 3D.

It should be noted that all four pads do not have to have the same longitudinal length. Larger patients will require additional length so that their entire bodies are supported. Smaller patients will require less length. Thus, in some embodiments, the pads may "stair-step" as pads of shorter length are added to pads of longer length as illustrated in FIG. 3D.

As noted above, four pads are described for illustrative purposes only. If thicker pads are used, then less pads are needed to position the patient. Similarly, if more exact positioning is desired, a greater number of thinner pads could be used to position the patient. Thus, any number of pads could be used and still be within the scope of the present invention.

Figure 4A:
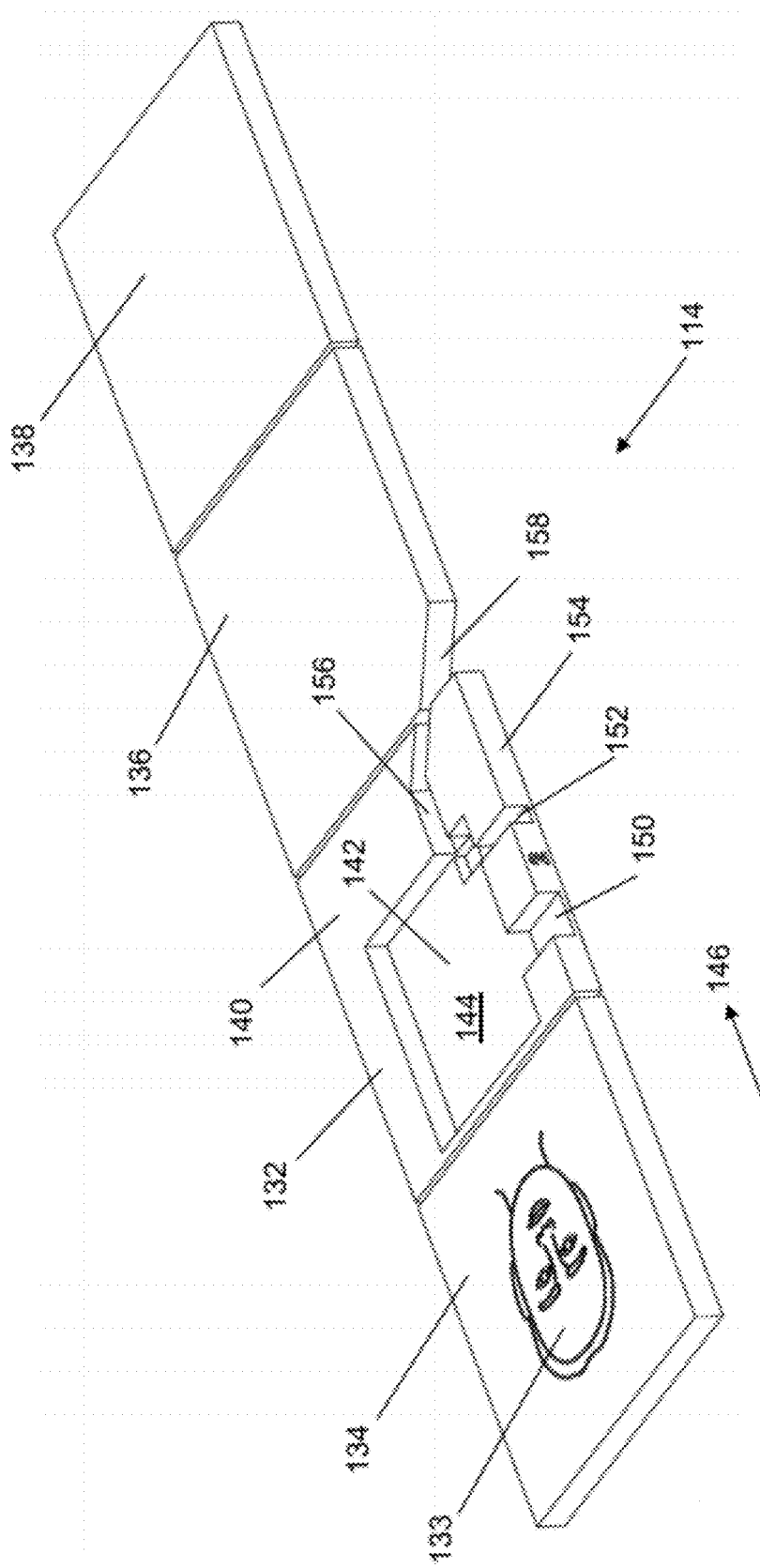
FIG. 4A is an isometric top view of one of the pads of the pad system of FIG. 3A.

FIG. 4A is a top isometric view of the pad 114. FIG. 4B is a bottom isometric view of the pad 114. FIG. 4C is an isometric view of the pad 114 in a partially collapsed configuration. FIG. 4D is an isometric view of the pad 114 is a fully collapsed configuration. Referring to FIGS. 4A through 4D, the details of the pad 114 will now be discussed.

In certain embodiments, the pad 114 comprises a coil cushion 132 and a plurality of support cushions 134, 136, and 138. In one embodiment of the cushions 132-138 are formed from polyurethane or polyethylene foam preferably closed cell structure and are enclosed with synthetic material like polyvinyl chloride resin (vinyl) or Tyvek produced by DuPont.

In certain embodiments, the coil cushion 132 has a top surface 140 and a generally rectangular indentation 142 defined therein. The indentation 142 is sized for the dual roles of accommodating a portion of a corresponding coil (not shown) when the patient is placed on the pad 114. In other situations, when pad 116 is placed on top of pad 114 (as illustrated in FIG. 3C) the indentation 142 receives a portion of a bottom projection (not shown) from pad 116 thereby laterally interlocking the two pads 116 and 114 together. In other embodiments, additional lateral interlocking mechanisms may be used such as a plurality of dowels extending transversely through the pads.

In certain embodiments, the indentation 142 has a bottom surface 144 which may be colored to correspond to a similar color of the corresponding coil (e.g. coil 204) so that the MRI machine operator will be able to easily know which coil to use with which pad. In other embodiments, other indicators may be used, such as letters, numbers or symbols. Indicators may also be placed on the side of the pads to make them identifiable when they are in a folded or storage configuration.

The support cushion 134 extends in a longitudinal direction 146 and is flexibly joined to the coil cushion 132. In a similar manner, the support cushion 136 extends in the longitudinal direction 148 and is flexibly joined to the coil cushion 132. The support cushion 138 is flexibly joined to support cushion 136. The number of the support cushions required depends on the estimated height of the patient. For instance, pad 112 (FIG. 3A) has a total of four support cushions. In certain embodiments, the support cushion 134 may have a direction indicator 133 to assist the MRI operator in proper patient positioning.

In certain embodiments, there are two lateral indentations or channels 150 and 152 which extend from the rectangular indentation 142 to a side surface 154 of the coil cushion 132. The indentations 150 and 152 allow portions of the coil positioning elements (not shown) to move out of the way of the patient when positioning a patient on the pad 114.

In some embodiments, there may be one or more longitudinal indentations or channels 156 for housing the coil cabling (not shown) leading from the coil to the MRI plug or interface (not shown). The longitudinal indentation 156 may either be straightened or bent to form an angle to lead the cables to the side surface of the pad 114 where the cables will be out of the way from the patient, but still can connect to the MRI interface. In certain embodiments, the adjacent support cushion 136 may also contain a beveled surface 158 to allow the cabling to be channeled to the side of the pad 114 as illustrated in FIG. 5.

Turning now to FIG. 4b, a projection 160 is defined on the bottom surface 162 of the coil cushion 132. The projection 160 is sized to fit within a rectangular indentation of the pad 112 (not shown) when the pad 114 is placed on top of pad 112. When the projection 160 is inserted into the rectangular indentation of the pad 112, the pad 112 and pad 114 are horizontally or laterally locked together.

In certain embodiments, a bottom indentation 164 is defined on a bottom surface 166 of the support cushion 134. The bottom indentation 164 is sized to accommodate the projection 160 when the pad is folded into a storage or folded configuration (e.g., FIG. 4D).

FIG. 4C illustrates the pad 114 in a partially folded configuration. A corner edge 168 of the support cushion 134 is flexibly coupled to an adjacent corner edge 170 of the coil cushion 132 to operate as a hinge. This hinge operation allows the coil cushion 132 to be folded on top of the support cushion 134. In a similar manner, the opposing diagonal corner edge 172 of the coil cushion 132 is flexibly coupled to a corner edge 174 of the support cushion 136. A corner edge 176 of support cushion 136 is flexibly coupled to a corner edge 178 of the support cushion 138. The hinge action provided by the flexible connections of the opposing corners (e.g., a continuous covering) that allows the pad 114 to be completely folded into a storage or folded configuration as illustrated in FIG. 4D.

Pads 112, 116, and 118 have details similar to pad 114 discussed above. Each pad has a coil cushion, but the number of support pads may vary depending on the overall desired length of the pad. Furthermore, the bottom pad (i.e., pad 112) does not have a bottom projection so it can lie flat on the MRI table. For brevity and clarity, a description of those details which are identical or similar to those described in connection with the pad 114 will not be repeated here.

FIG. 5A is an isometric drawing illustrating a particular configuration when the coil 204 is partially positioned within indentation 142 of the pad 114. The bottom projection 164 (not shown) of the pad 114 is partially positioned within an indentation (not shown) of the pad 112 to couple the pads together. As discussed above, certain embodiments of the pad system 130 are designed to be used with a coil system comprising a plurality of coils of different sizes.

Figure 5B:
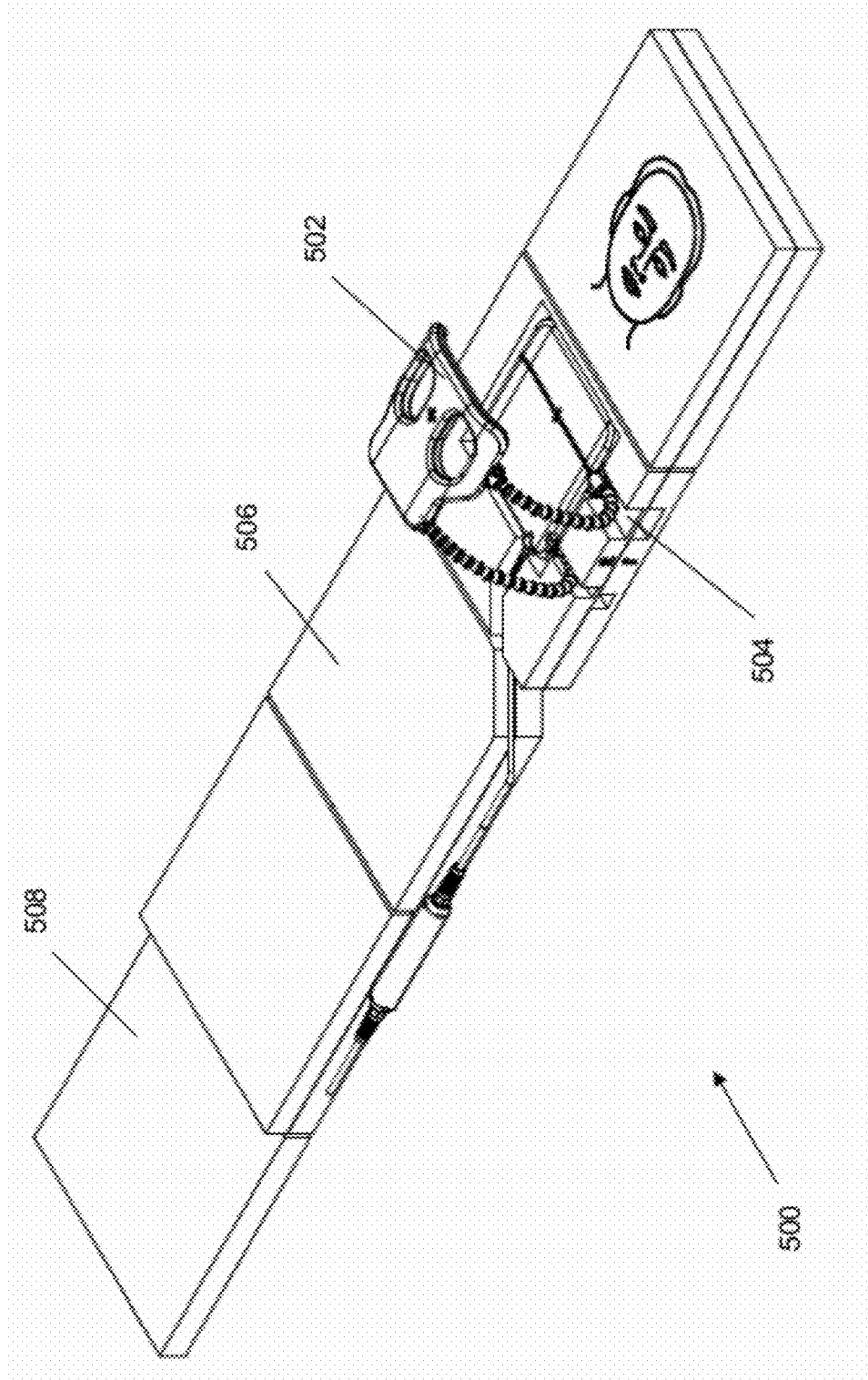
FIG. 5B is an isometric view of an alternative configuration of certain pads coupled to a coil.

FIG. 5B is an isometric drawing illustrating an alternative system 500 when the coil 502 is partially positioned within indentations 504 of a pad 506 which is designed to fit on top of the pad 508 as described above. In the alternative system 500, the configuration of the coil 502, indentations 504 in the pad 506 are "flipped" which allows patient access from the other side of the coil 502 and pad 506. The details of the alternative system 500 is similar to the system 200 described herein. Consequently, those details will not be repeated for the system 500.

FIGS. 6A through 6E are isometric drawings illustrating a plurality of coils 210-202 forming embodiments of the receive coil system 200 which may be used in conjunction with the pad system 130. As discussed above, the coil system 200 comprises a plurality of receive coils of different sizes to accommodate a range of patients. Each receive coil comprises an anterior antenna assembly and a posterior antenna assembly.

In one embodiment, receive coils are designed for cardiac application. Thus, the individual coils have different dimensions and configurations designed to fit the chest cavity of a particular range of patients. For instance, babies (from newborn to 1.5-years) have a typical cardiac chest size range between 4.6"-6.3." In one embodiment, illustrated in FIG. 6A, a coil 210 may be sized for this size of patient. Thus, in certain embodiments, the anterior antenna assembly 212 may have a width "A" of 4.5". The corresponding posterior antenna assembly 214 may have a width "B" of 9.5"

Small children (from 1.5-year old-5-year old) have a typical cardiac chest size range between 6.3"-6.7." In one embodiment, illustrated in FIG. 6B, a coil 208 may be sized for this size of patient. Thus, in certain embodiments, the anterior antenna assembly 216 may have a width "A" of 6.3". The corresponding posterior antenna assembly 218 may have a width "B" of 6.7"

Larger children (typically from 6-year old-10-year old) have a typical cardiac chest size range between 7.0"-8.2." In one embodiment, illustrated in FIG. 6C, a coil 206 may be sized for this size of patient. Thus, in certain embodiments, the anterior antenna assembly 220 may have a width "A" of 8.5". The corresponding posterior antenna assembly 222 may have a width "B" of 8.75."

Adolescents and young teenagers (typically from 11-year old-14-year old) have a typical cardiac chest size range between 8.3"-10.1." In one embodiment, illustrated in FIG. 6D, a coil 204 may be sized for this size of patient. Thus, in certain embodiments, the anterior antenna assembly 224 may have a width "A" of 10.0". The corresponding posterior antenna assembly 226 may have a width "B" of 11.5."

Teenagers (typically 15-year old-18-year old) have a typical cardiac chest size range between 10.4"-10.9". In one embodiment, illustrated in FIG. 6E, a coil 202 may be sized for this range of patients. Thus, in certain embodiments, the anterior antenna assembly 228 may have a width "A" of 11.5. The corresponding posterior assembly 230 may have a width "B" of 11.5."

The above description outlines the exemplary dimensions for one embodiment of a receive coil system using five coils. Other embodiments of the present invention may use two, three, four or six receive coils. Furthermore, other embodiments may use a different set of dimensions depending on the configuration and range of chest size desired. For instance, the widths "A" and "B" described above may vary. For instance, in one embodiment, the widths may vary by plus or minus 20 percent.

Figure 6E:
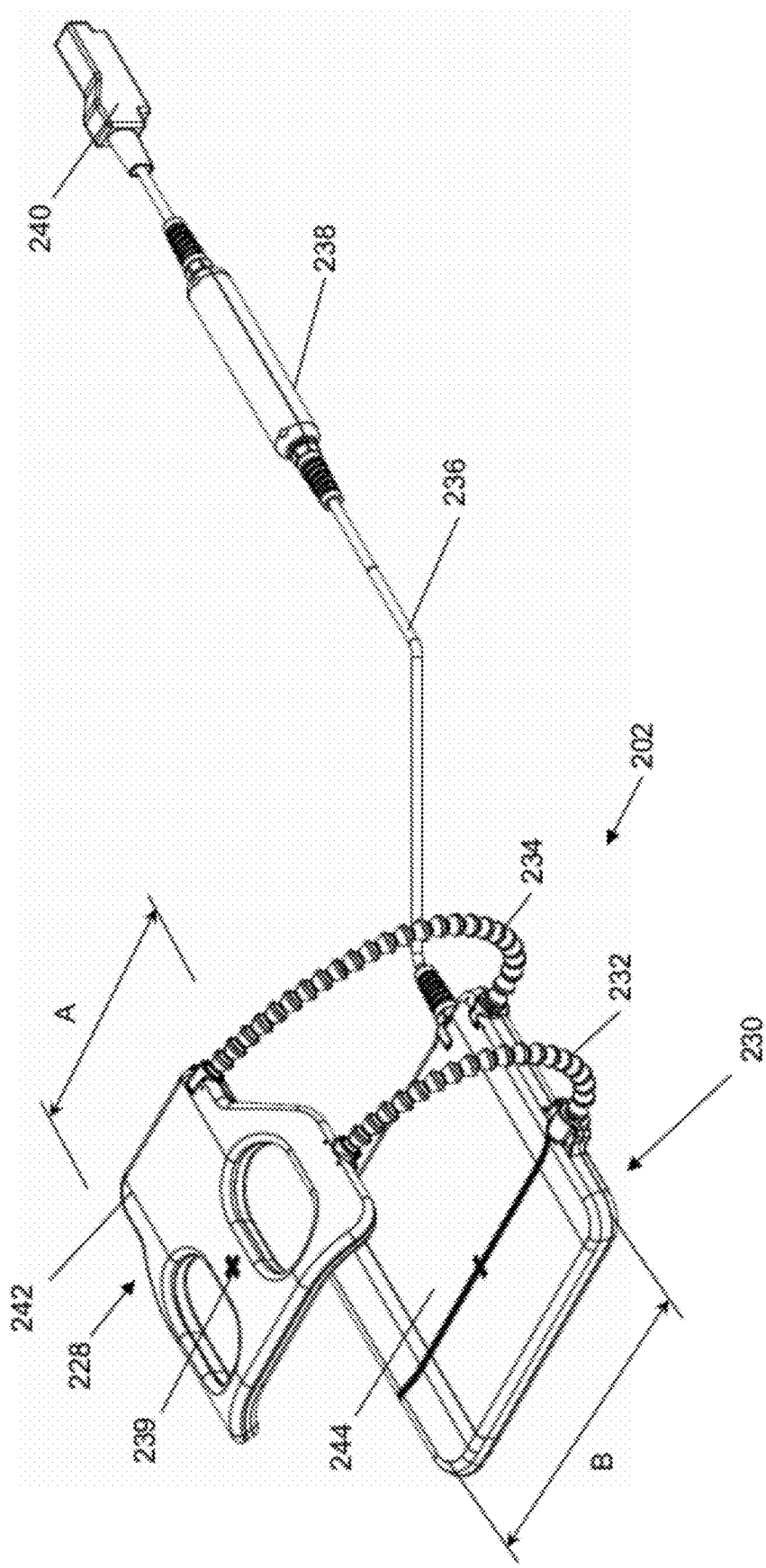

For purposes of this specification disclosure, a "coil" is defined to be a coil assembly such as coil 202 illustrated in FIG. 6E. Thus, in the illustrated embodiment, the coil 202 comprises the anterior antenna assembly 228, the posterior antenna assembly 230, a first flexible connector 232, a second flexible connector 234, a main coil cable 236, an in-line balun 238, and a MRI connector or interface 240.

Certain embodiments of the anterior antenna assembly 228 use a rigid housing, such as a rigid housing 242. Similarly, certain embodiments of the posterior antenna assembly 230 use a rigid housing 244. In certain embodiments, the rigid housings 242 and 244 may be made from ABS or polycarbonate or ridgid PVC having a durometer range of 100 to 120. The use of rigid housings which do not bend or flex maintains proper factory tuning. Alternative embodiments, however, may use a flexible housing.

In certain embodiments, the anterior antenna housing, such as housing 242 may be marked with a cross 239 which allows the MRI operator to align the anterior antenna assembly 228 with a laser sight (not shown) positioned on the MRI (not shown).

FIG. 7A is an isometric view of the anterior antenna assembly 228 and the posterior antenna assembly 230 with the top halves of the rigid housings 242 and 244 removed for clarity.

The anterior antenna assembly 228 includes two radio frequency (RF) coil antennas 246a and 246b which may be formed from metallic strips (such as copper). The coil antennas 246a and 246b are designed to receive MRI radio frequencies from the patient. The coil antennas are sized appropriately for a specific size range of patients to balance high signal-to-noise ratio with coverage of the intended area of interest. The coil antennas are tuned to resonate at center frequency of the MRI magnet.

The coil antenna 246a is in electrical communication with a preamp 248a via an inductor, which is part of an active detuning system. Similarly, the coil antenna 246b is in electrical communication with a preamp 248b via a second inductor, which is part of a second active detuning system (not shown). The preamps 248a and 248b are used to amplify the RF signals from the coil antennas 246a and 246b, respectively. PIN Bias signal is provided to PIN Diodes to tune/detune the antennas.

The preamp 248a is electrically coupled to a balun assembly 250a. Similarly, the preamp 248b is electrically coupled to a balun assembly 250b. The balun assemblies 250a and 250b are used to remove interaction between different radio channels. In certain embodiments, the balun assemblies use a "figure 8" inductor winding via grooves defined within the housing 242. RF signal cables (not shown) from the balun assemblies 250a and 250b and power cables (not shown) for the preamps 248a and 248b are positioned in a longitudinal conduct (FIG. 7b) defined within the flexible member 234. The cables (not shown) exit into the posterior antenna housing 244 and continue into the main coil cable 252.

The posterior antenna assembly 230 also includes two RF coil antennas 254a and 254b which may be formed from metallic strips (such as copper). The coil antennas 254a and 254b are designed to receive MRI radio frequencies from the patient.

The coil antenna 254a is in electrical communication with a preamp 256a. Similarly, the coil antenna 254b is in electrical communication with a preamp 256b. The preamps 256a and 256b are used to amplify the RF signals from the coil antennas 254a and 254b, respectively.

The preamp 254a is electrically coupled to a balun assembly 260a. Similarly, the preamp 254b is electrically coupled to a balun assembly 260b. The balun assemblies 260a and 260b are used to remove interaction between different radio channels. RF signal cables from the balun assemblies 260a and 260b, power cables for the preamps 248a and 248b, and PIN bias cables (not shown) run through the main coil cable 252 where they are coupled to the MRI connector 240. The circuitry for each coil antenna has safety mechanisms such as passive detuning and active detuning to prevent high current from flowing through the respective coil preamps.

Figure 7B:
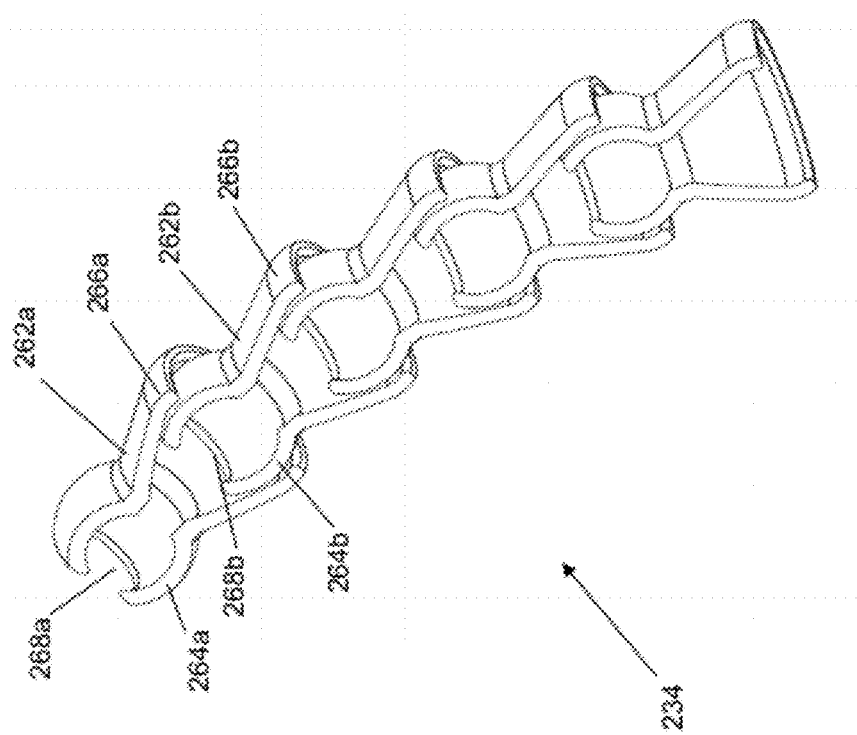
FIG. 7B is a detailed isometric section view of a portion of a flexible connecting member.

FIG. 7B is an isometric section view of a portion of the flexible connector 234. As illustrated, the flexible connector comprises a plurality of interlocking segments, for instance, segments 262a and 262b. On a first end of each segment there is defined a partially spherical element, such as spherical elements 264a and 264b. On the opposing end of each segment, there is defined a socket portion, such a socket portions 266a and 266b. The socket portions (e.g., 266a) are sized to accommodate a portion of the adjacent spherical element (e.g. 264a) to create a ball and socket effect which allows segment 262a to rotate with respect to segment 262b.

The spherical elements 264a and 264b have apertures 268a and 268b, respectively. The use of apertures 268a and 268b forms a conduit longitudinally through the flexible connector which allows cabling to be positioned within the conduit.

The plurality of segments which comprise the flexible connector (i.e. connectors 234 or 232) allows the anterior antenna assembly 228 (FIGS. 7A and 6E) to be moved with respect to the posterior antenna assembly 230, thus, allowing a wide range of placement of the anterior antenna assembly 228. The flexible connectors allow the anterior antenna assembly to be moved out of the way while the patient is being positioned on a pad. Then, the anterior assembly can be positioned close to the patient's chest for high resolution images as illustrated in FIG. 8.

Figure 8:
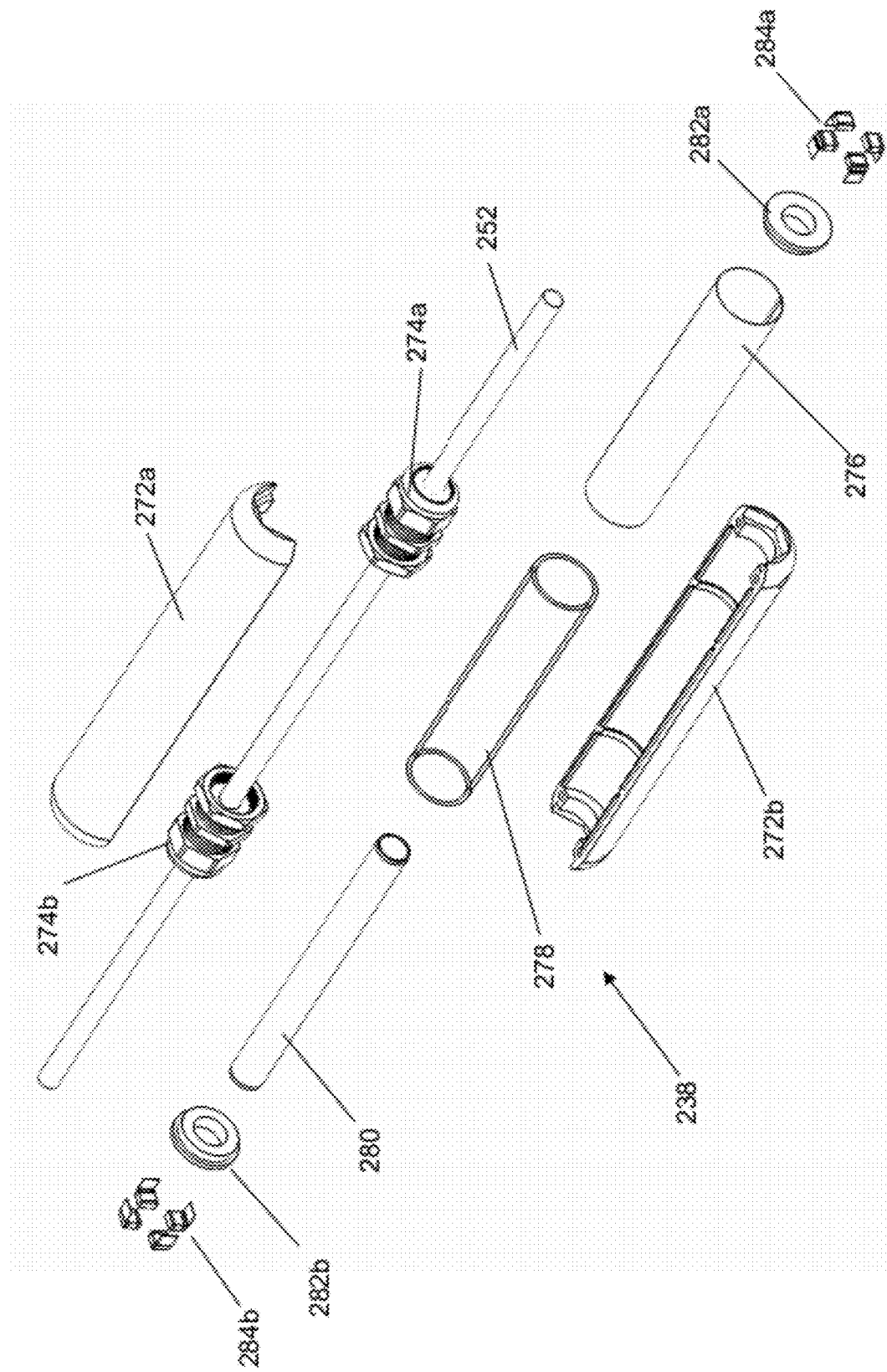
FIG. 8 is an exploded isometric view of one embodiment of a balun.

Turning now to FIG. 8, there is an exploded view of one embodiment of the in-line balun 238 (see FIG. 6E). The in-line balun 238 is used to remove interaction between the RF cables running through the coil cable 252. Certain embodiments of the balun 238 include an outer balun case which includes a first portion 272a and a second portion 272b. The outer balun case is longitudinally positioned between a first cable strain relief 274a and a second strain relief 274b. Positioned within the outer balun case and about the coil cable 252 is an outer copper shield tube 276 (made from copper foil), a plastic outer tube former 278, and an inner copper tube 280. Plastic tube plugs 282a and 282b centers the inner copper shield tube 280 within the outer copper shield tube 276. Chip capacitors 282a and 282b electrically couple the inner copper shield tube 280 to the outer copper shield tube 276. The capacitors are selected to resonate with inductance created by inner and outer copper tubes.

Coils 204, 206, 208, and 210 have details similar to the coil 202 discussed above. For brevity and clarity, a description of those details which are identical or similar to those described in connection with the coil 202 will not be repeated here.

Figure 9:
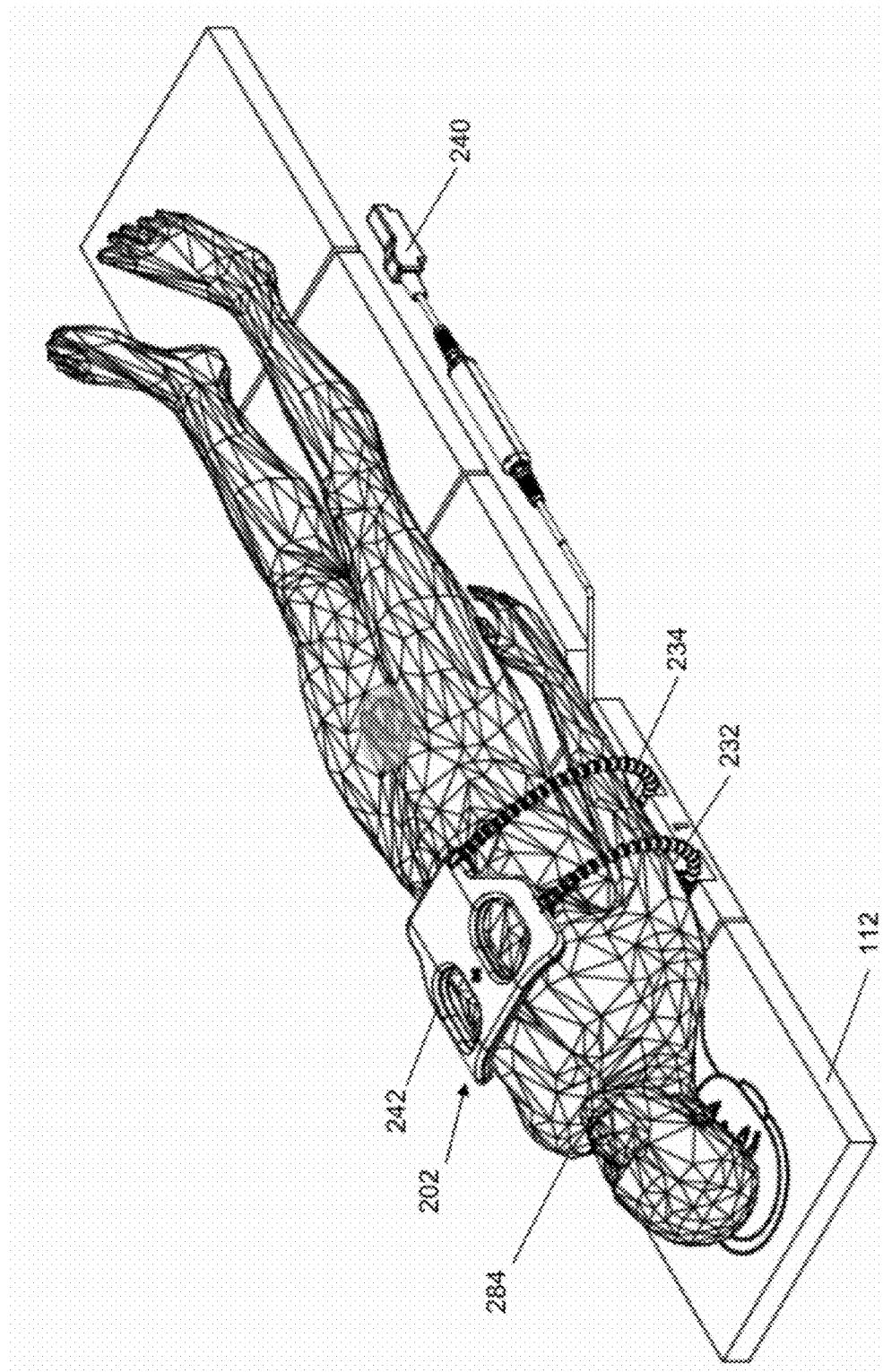
FIG. 9 is an isometric view of a pad coupled to a coil positioned about a patient.

FIG. 9 is an isometric drawing illustrating a patient 284 positioned on the pad 112. The pad 112 is designed to be placed on an MRI table, which is then positioned into an MRI machine as is typical in the art. As previously discussed, a coil, such as coil 202 is specifically designed to work with the pad 112. The posterior antenna assembly 214 (not shown) of the coil 202 is placed within an indentation (not shown) defined within the top surface of coil cushion of the pad 112. Flexible members 232 and 234 allow the anterior antenna assembly 228 to be positioned about the patient 284 at the desired position to increase resolution of the images. Signals from the coil 202 are then supplied to the MRI console through the MRI connector 240. When the scanning is complete the coil 202 and the pad 112 may be stored in the storage unit 120 as illustrated in FIG. 1B.

Figure 10:
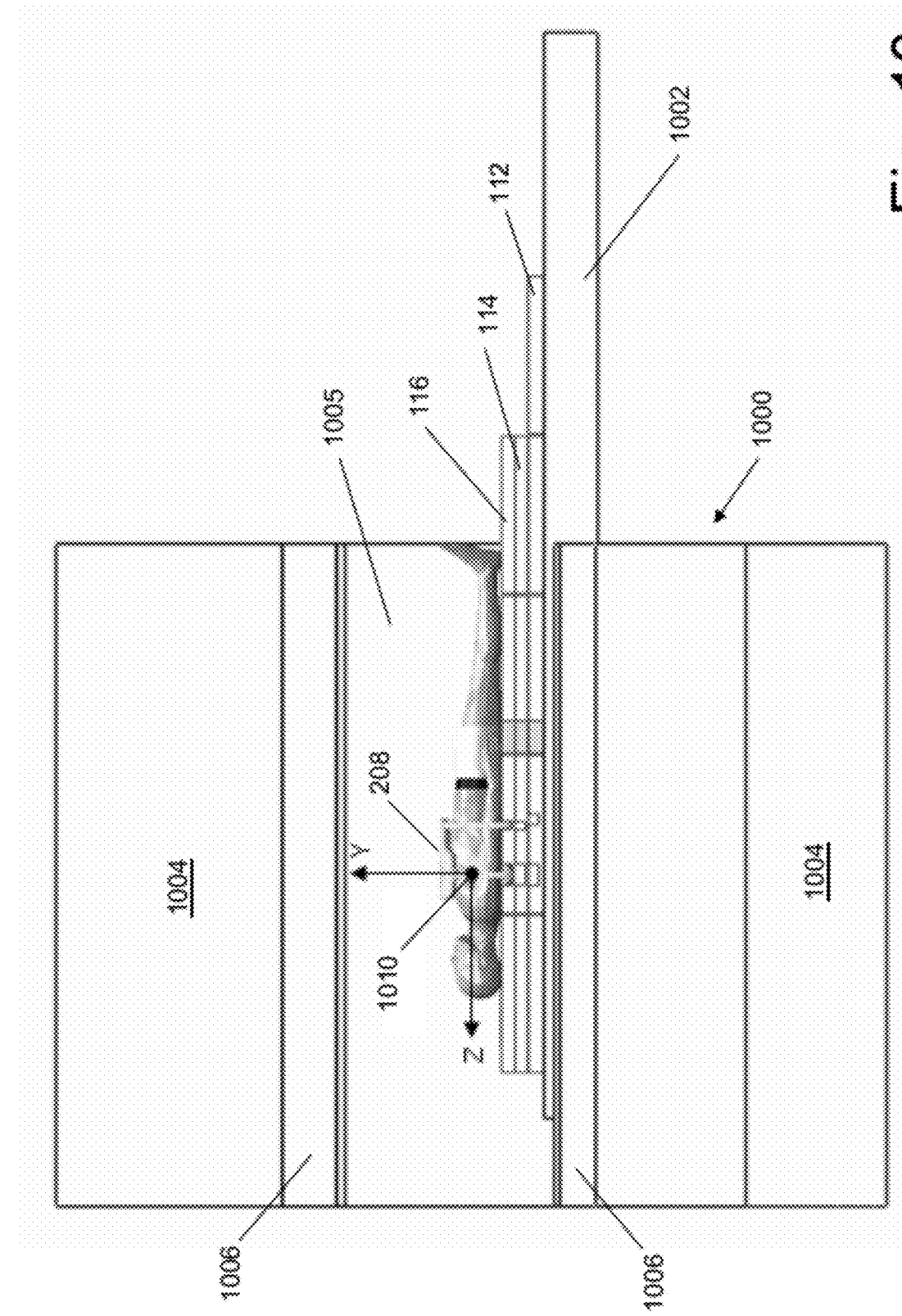
FIG. 10 is a section view of an MRI scanner using an embodiment of the pad system of the present invention.

FIG. 10 is a section view of an MRI scanner 1000. The MRI scanner 1000 contains the MRI magnet 1004 having a longitudinal bore 1005 so that a strong stable magnetic field can be produced by the magnet 1004 inside the bore 1005. An MRI table 1002 is illustrated partially positioned within the bore 1005. One or more gradient magnets 1006 are positioned on the interior of the MRI magnet 1004 about the bore 1005 as can be seen in this conceptual section view. The gradient magnets 1006 create a variable field, which allows different parts of the body to be scanned.

In this example, pads 112, 114, and 116 have been placed upon the MRI table 1002. A patient is placed on the pads and the coil 208 has been placed around and close to the patient's chest. As discussed above, the coil 208 is designed to receive radiofrequency waves from the patient's body.

In order to obtain the highest quality MR images, the region of interest (in this case the patient's heart), is to be placed at the center of the magnet 1004. The center is also known as the magnet's isocenter 1010.

MRIs are currently designed to place the midplane of an average adult at the isocenter 1010 with a single pad designed primarily for comfort. However, such a configuration may not be adequate for smaller adults and children because the region of interest (e.g. the heart) is not aligned with the isocenter 1010.

By using multiple pads, such as pads 112, 114, and 116, the smaller patient is elevated to the magnet's isocenter 1010. This elevation may occur in specific increments by using a combination of pads based on the patient's age group (if children) or on other anatomical characteristics, such as height and weight so that the patient may be vertically positioned close to the isocenter 1010. Additionally, as described above, the coil sets 202, 204, 206 or 208 are selected to match the patient's anatomical characteristics. Thus, the region of interest may more closely correspond to the magnet's isocenter 1010 resulting in more accurate images.

The abstract of the disclosure is provided for the sole reason of complying with the rules requiring an abstract, which will allow a searcher to quickly ascertain the subject matter of the technical disclosure of any patent issued from this disclosure. It is submitted with the understanding that it will not be used to interpret or limit the scope or meaning of the claims.

Any advantages and benefits described may not apply to all embodiments of the invention. When the word "means" is recited in a claim element, Applicant intends for the claim element to fall under 35 USC 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC 112, paragraph 6.

The foregoing description of the embodiments of the invention has been presented for the purposes of illustration and description. It is not intended to be exhaustive or to limit the invention to the precise form disclosed. Many combinations, modifications and variations are possible in light of the above teaching. For instance, in certain embodiments, each of the above described components and features may be individually or sequentially combined with other components or features and still be within the scope of the present invention. Undescribed embodiments which have interchanged components are still within the scope of the present invention. It is intended that the scope of the invention be limited not by this detailed description, but rather by the claims.

For instance, in some embodiments, there may be a receive coil and pad system comprising: three receive coils wherein each coil has a different set of physical dimensions and a different indicator. Each coil includes a posterior antenna assembly comprising a coil housing, a first RF coil antenna, a first pre-amplifier coupled to the first RF coil antenna, and a first interior balun coupled to the first pre-amplifier, a second RF coil antenna, a second pre-amplifier coupled to the second RF coil antenna, and a second interior balun coupled to the second pre-amplifier. Each coil may also include an anterior antenna assembly comprising a coil housing, a first RF coil antenna, a first pre-amplifier coupled to the first RF coil antenna, and a first interior balun coupled to the first pre-amplifier, a second RF coil antenna, a second pre-amplifier coupled to the second RF coil antenna, and a second interior balun coupled to the second pre-amplifier.

Additionally each coil may include an exterior in-line balun positioned about a coil cable assembly, at least one flexible positioning member coupling the anterior coil to the posterior coil, the at least one flexible member containing a longitudinal conduit.

The above system may also comprise a plurality of pads corresponding to the plurality of coil sets, wherein each pad has a pad indicator corresponding to one of the indicators of the three receive coils, wherein the plurality of pads comprise: a first pad comprising a first coil cushion and a support cushion, wherein the first coil cushion is adapted to interlock with the first coil set, a second pad comprising a second coil cushion adapted for interlocking with the first coil cushion or the second coil, and a plurality of support cushions, and third pad comprising a third coil cushion adapted for interlocking with the second coil cushion or the third coil, and a plurality of support cushions.

Additional embodiments may include a fourth pad comprising a fourth coil cushion adapted to couple or interlock with the third coil cushion and the fourth coil, and plurality of support cushions.

In other embodiments, the coil and pad system may include a storage unit comprising a plurality of compartments for storing the coils and the pads.

Other embodiments may include the system as above, further comprising a fifth receive coil adapted to be used with the fourth pad.

Other embodiments may include the system as above, wherein each coil further comprises a second flexible positioning member coupling the anterior antenna assembly to the posterior antenna assembly, wherein the flexible members positioning member comprises a plurality of interlocking segments.

Other alternative embodiments could comprise a pad system for use with an MRI machine, comprising a first pad comprising a first coil cushion and a support cushion, a second pad comprising a second coil cushion adapted to interlocking with the first coil cushion and a plurality of support cushions, a third pad comprising a third coil cushion interlocking with the second coil cushion and a plurality of support cushions.

In yet other embodiments, there may be fourth pad comprising a fourth coil cushion interlocking with the third coil cushion and a plurality of support cushions In the above system, the second pad may comprise a coil indentation defined within the top surface of the coil cushion and adapted to encompass a portion of a coil system, a projection on the bottom surface of the coil cushion adapted to fit within a coil indentation of an adjacent pad.

In the above system, the second pad may comprise a first support cushion of the plurality of support cushions which is flexibly coupled to the second coil cushion along a corner edge of the coil cushion and a corner edge of the support cushion and second support cushion of the plurality of support cushions flexibly coupled to second coil cushion along an opposing corner edge of the coil cushion and a second corner edge of the second support cushion.

The second pad may also comprise a third support cushion of the plurality of support cushions flexibly coupled to the second support cushion along an opposing corner edge of the second support cushion and a corner edge of the third support cushion.

The second pad may also comprise a fourth support cushion of the plurality of support cushions flexibly coupled to the third support cushion along an opposing corner edge of the third support cushion and a corner edge of the fourth support cushion.

In the above system, the second pad may also comprise at least one lateral indentation defined within the top surface of the coil cushion in communication with the coil indentation.

In the above system, the second pad may also comprise at least one longitudinal indentation defined within the top surface of the coil cushion in communication with the coil indentation.

The system as above, further comprising a third pad comprising features similar to the second pad.

The system as above, further comprising a fourth pad comprising features similar to the second pad.

In yet other embodiments, there may be a receive coil with at least one flexible connector, comprising a posterior antenna assembly which includes an assembly housing and at least one RF coil antenna, a anterior antenna assembly which includes an assembly housing and at least one RF coil antenna.

The coil as above further comprising a cable housing coupling the anterior coil housing to an MRI interface, an exterior in-line balun coupled to the cable housing.

In other embodiments, the flexible connector may be a first flexible positioning member coupling the anterior coil to the posterior coil.

In other embodiments, the coil may include a second flexible positioning member coupling the anterior coil to the posterior coil.

In other embodiments, the flexible connectors may include a longitudinal conduit.

In other embodiments, the flexible connectors may comprise a plurality of interlocking members wherein certain members of the interlocking members are rotatable with respect to their adjacent members.

In other embodiments, the certain members of the interlocking members each comprise a ball joint on one end and a socket on the opposing end.

In yet other embodiments, there may be a coil system comprising a plurality of receive coils of different sizes.

In yet other embodiments, there may be a pad system comprising a plurality of pads of different sizes.

In yet other embodiments, there may be a coil and pad system comprising a plurality of receive coils and a plurality of pads corresponding to the plurality of receive coils.

In yet other embodiments, there may be a coil and pad system comprising a plurality of receive coils and a plurality of pads corresponding to the plurality of receive coils wherein each pad of the plurality of pads has an indentation which accommodates at least one of the plurality of receive coils.

What is claimed is:

1. A receive coil and pad system for use with a magnetic resonance imaging machine, the system comprising:
   a first receive coil of a first size having a first indicator, the first receive coil including
   a first posterior antenna means,
   a first anterior antenna means,
   a first pair of flexible members coupling the first posterior antenna means to the first anterior antenna means, wherein at least one of the flexible members contains a first conduit,
   a second receive coil of a second size having a second indicator, the second receive coil including
   a second posterior antenna means,
   a second anterior antenna means,
   a second pair of flexible members coupling the second posterior antenna means to the second anterior antenna means, wherein at least one of the flexible members contains a second conduit,
   a third receive coil of a third size having a third indicator, the third receive coil including
   a third posterior antenna means,
   a third anterior antenna means,
   a third pair of flexible members coupling the third posterior antenna means to the third anterior antenna means, wherein at least one of the flexible members contains a third conduit,
   a fourth receive coil of a fourth size having a fourth indicator, the fourth receive coil including
   a fourth posterior antenna means,
   a fourth anterior antenna means,
   a fourth pair of flexible members coupling the fourth posterior antenna means to the fourth anterior antenna means, wherein at least one of the flexible members contains a fourth conduit,
   a first pad having a first indentation sized to partially accommodate the first receive coil and a first corresponding indicator which corresponds to the first indicator of the first receive coil,
   a second pad having a second indentation sized to partially accommodate the second receive coil and a second corresponding indicator which corresponds to the second indicator of the second receive coil,
   a third pad having a third indentation sized to partially accommodate the third receive coil and a third corresponding indicator which corresponds to the third indicator of the third receive coil,
   a fourth pad having a fourth indentation sized to partially accommodate the fourth receive coil and a fourth corresponding indicator which corresponds to the fourth indicator of the fourth receive coil, and
   wherein the first, second, third and fourth sizes are different, and a storage unit to accommodate the first receive coil, the second receive coil, the third receive coil, the fourth receive coil, the first pad, the second pad, the third pad, and the fourth pad
   wherein each flexible member of the first, the second, the third, and the fourth pair of flexible members further comprises a plurality of interlocking segments wherein each interlocking segment in the plurality of segments can rotate with respect to an adjacent segment.

2. The receive coil and pad system of claim 1, wherein the first pad further comprises a second support cushion flexibly coupled to the first coil cushion at adjoining edges.

3. The receive coil and pad system of claim 2, wherein the first pad further comprises a third support cushion flexibly coupled to the second coil cushion at adjoining edges.

4. The receive coil and paid system of claim 1 wherein the first, second, third, and fourth indicators are colors wherein each color is noticeably different from each other.

5. A receive coil and pad system for use with a magnetic resonance imaging machine, the system comprising:
   a first receive coil of a first size having a first indicator, the first receive coil including
   a first posterior antenna means,
   a first anterior antenna means,
   a first pair of flexible members coupling the first posterior antenna means to the first anterior antenna means, wherein at least one of the flexible members contains a first conduit,
   a second receive coil of a second size having a second indicator, the second receive coil including
   a second posterior antenna means,
   a second anterior antenna means,
   a second pair of flexible members coupling the second posterior antenna means to the second anterior antenna means, wherein at least one of the flexible members contains a second conduit,
   a third receive coil of a third size having a third indicator, the third receive coil including
   a third posterior antenna means,
   a third anterior antenna means,
   a third pair of flexible members coupling the third posterior antenna means to the third anterior antenna means, wherein at least one of the flexible members contains a third conduit,
   a fourth receive coil of a fourth size having a fourth indicator, the fourth receive coil including a fourth posterior antenna means, a fourth anterior antenna means, a fourth pair of flexible members coupling the fourth posterior antenna means to the fourth anterior antenna means, wherein at least one of the flexible members contains a fourth conduit, a first pad having a first indentation sized to partially accommodate the first receive coil and a first corresponding indicator which corresponds to the first indicator of the first receive coil, a second pad having a second indentation sized to partially accommodate the second receive coil and a second corresponding indicator which corresponds to the second indicator of the second receive coil, a third pad having a third indentation sized to partially accommodate the third receive coil and a third corresponding indicator which corresponds to the third indicator of the third receive coil, a fourth pad having a fourth indentation sized to partially accommodate the fourth receive coil and a fourth corresponding indicator which corresponds to the fourth indicator of the fourth receive coil, and wherein the first, second, third and fourth sizes are different, and a storage unit to accommodate the first receive coil, the second receive coil, the third receive coil, the fourth receive coil, the first pad, the second pad, the third pad, and the fourth pad wherein the first pad further comprises a first coil cushion and a support cushion flexibly coupled together at adjoining edges, wherein the first coil cushion comprises:

the first indentation defined on a top face sized, and a first projection defined on a bottom face.

6. The receive coil and pad system of claim 5, wherein the first pad further comprises a second support cushion flexibly coupled to the first coil cushion at adjoining edges.

7. The receive coil and pad system of claim 6, wherein the first pad further comprises a third support cushion flexibly coupled to the second coil cushion at adjoining edges.

8. The receive coil and paid system of claim 5 wherein the first, second, third, and fourth indicators are colors wherein each color is noticeably different from each other.

9. A receive coil and pad system for use with a magnetic resonance imaging machine, the system comprising:

a plurality of receive coils, wherein each receive coil has a different size and different indicator from the other coils in the plurality of receive coils and also includes, a posterior antenna means, an anterior antenna means, a pair of flexible members coupling the first posterior antenna means to the first anterior antenna means, wherein at least one of the flexible members contains at least one conduit and a plurality of interlocking segments wherein a majority of interlocking segments in the plurality of segments can rotate with respect to an adjacent segment, and a plurality of pads, wherein each pad in the plurality of pads includes a indentation sized to partially accommodate at least one of the plurality of receive coils and a pad indicator which corresponds to the indicator of at least one of the plurality of receive coils.

10. The receive coil and pad system of claim 9, wherein each pad in the plurality of pads further comprises a first coil cushion and a support cushion flexibly coupled together at adjoining edges, wherein the first coil cushion includes the indentation defined on a top face, and a first projection defined on a bottom face.

11. The receive coil and pad system of claim 10, wherein each pad in the plurality of pads further comprises a second support cushion flexibly coupled to the first coil cushion at adjoining edges.

12. The receive coil and paid system of claim 9 wherein each different indicator is a color.

\* \* \* \* \*